US007943847B2

(12) United States Patent
Kempa et al.

(10) Patent No.: US 7,943,847 B2
(45) Date of Patent: May 17, 2011

(54) APPARATUS AND METHODS FOR SOLAR ENERGY CONVERSION USING NANOSCALE COMETAL STRUCTURES

(75) Inventors: Krzysztof J. Kempa, Billerica, MA (US); Michael J. Naughton, Norwood, MA (US); Zhifeng Ren, Newton, MA (US); Jakub A. Rybczynski, Cambridge, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 1271 days.

(21) Appl. No.: 11/509,269

(22) Filed: Aug. 24, 2006

(65) Prior Publication Data
US 2007/0137697 A1    Jun. 21, 2007

Related U.S. Application Data

(63) Continuation-in-part of application No. 11/401,606, filed on Apr. 10, 2006.

(60) Provisional application No. 60/711,004, filed on Aug. 24, 2005, provisional application No. 60/799,293, filed on May 9, 2006.

(51) Int. Cl.
*H01L 25/00* (2006.01)
*H01L 31/00* (2006.01)
*H01L 31/042* (2006.01)
*H02N 6/00* (2006.01)

(52) U.S. Cl. ........ 136/255; 136/243; 136/246; 136/252; 136/259

(58) Field of Classification Search .......... 136/243–265; 356/424, 434; 252/501.1
See application file for complete search history.

(56) References Cited

U.S. PATENT DOCUMENTS

| 3,312,870 A | 4/1967 | Rhoades |
| 3,401,369 A | 9/1968 | Palmateer et al. ............... 339/17 |
| 3,432,664 A | 3/1969 | Robison ......................... 250/98 |
| 3,711,848 A | 1/1973 | Martens ....................... 340/280 |

(Continued)

FOREIGN PATENT DOCUMENTS
EP    1507298    2/2005
(Continued)

OTHER PUBLICATIONS

Atwater et al., *The New "p-n Junction": Plasmonics Enables Photonic Access to the Nanoworld*, MRS Bulletin, 30 (5), pp. 385-389, ISSN 0883-7694, May 2005.

(Continued)

*Primary Examiner* — Nam X Nguyen
*Assistant Examiner* — Kourtney R Salzman
(74) *Attorney, Agent, or Firm* — Greenberg Traurig, LLP; David J. Dykeman; Danielle T. Abramson

(57) ABSTRACT

An apparatus and methods for solar conversion using nanoscale cometal structures are disclosed herein. The cometal structures may be coaxial and coplanar. A nanoscale optics apparatus for use as a solar cell comprises a plurality of nanoscale cometal structures each including a photovoltaic material located between a first electrical conductor and a second electrical conductor. A method of fabricating solar cells comprises preparing a plurality of nanoscale planar structures; coating a plurality of planar surfaces of the plurality of planar structures with a photovoltaic semiconductor while leaving space between the plurality of planar surfaces; and coating the photovoltaic semiconductor with an outer electrical conductor layer, wherein a portion of the outer electrical conductor layer is located between the planar structures to form coplanar structures.

17 Claims, 20 Drawing Sheets

U.S. PATENT DOCUMENTS

| | | | | |
|---|---|---|---|---|
| 3,821,664 A | 6/1974 | Godard et al. | | 331/94.5 |
| 3,990,914 A | 11/1976 | Weinstein et al. | | 136/89 |
| 4,105,470 A | 8/1978 | Skotheim | | 136/89 SJ |
| 4,197,142 A | 4/1980 | Bolton et al. | | 136/89 SJ |
| 4,360,703 A | 11/1982 | Bolton et al. | | 136/263 |
| 4,445,050 A | 4/1984 | Marks | | 307/145 |
| 4,445,080 A | 4/1984 | Curtiss | | 318/798 |
| 4,774,554 A | 9/1988 | Dentai et al. | | 357/17 |
| 4,783,605 A | 11/1988 | Tomisawa et al. | | 307/450 |
| 4,803,688 A | 2/1989 | Lawandy | | 372/21 |
| 4,854,876 A | 8/1989 | Heath et al. | | 434/29 |
| 4,886,555 A | 12/1989 | Hackstein et al. | | 136/255 |
| 4,913,744 A * | 4/1990 | Hoegl et al. | | 136/244 |
| 5,009,958 A | 4/1991 | Yamashita et al. | | 428/411.1 |
| 5,028,109 A | 7/1991 | Lawandy | | 350/96.12 |
| 5,078,803 A | 1/1992 | Pier et al. | | 136/256 |
| 5,084,365 A | 1/1992 | Gratzel et al. | | 429/111 |
| 5,105,305 A | 4/1992 | Betzig et al. | | 359/368 |
| 5,157,674 A | 10/1992 | Lawandy | | 372/22 |
| 5,171,373 A | 12/1992 | Hebard et al. | | 136/252 |
| 5,185,208 A | 2/1993 | Yamashita et al. | | 428/411.1 |
| 5,211,762 A | 5/1993 | Isoda et al. | | 136/263 |
| 5,233,621 A | 8/1993 | Lawandy | | 372/22 |
| 5,250,378 A | 10/1993 | Wang | | 430/83 |
| 5,253,258 A | 10/1993 | Lawandy | | 372/22 |
| 5,264,048 A | 11/1993 | Yoshikawa et al. | | 136/263 |
| 5,267,336 A | 11/1993 | Sriram et al. | | 385/2 |
| 5,272,330 A | 12/1993 | Betzig et al. | | 250/216 |
| 5,291,012 A | 3/1994 | Shimizu et al. | | 250/216 |
| 5,331,183 A | 7/1994 | Sariciftci et al. | | 257/40 |
| 5,332,910 A | 7/1994 | Haraguchi et al. | | 257/13 |
| 5,333,000 A | 7/1994 | Hietala et al. | | 342/368 |
| 5,360,764 A | 11/1994 | Celotta et al. | | 437/173 |
| 5,380,410 A | 1/1995 | Sawaki et al. | | 204/130 |
| 5,383,038 A | 1/1995 | Lawandy | | 359/7 |
| 5,434,878 A | 7/1995 | Lawandy | | 372/43 |
| 5,437,736 A | 8/1995 | Cole | | 136/259 |
| 5,448,582 A | 9/1995 | Lawandy | | 372/42 |
| 5,479,432 A | 12/1995 | Lawandy | | 372/102 |
| 5,481,630 A | 1/1996 | Lawandy | | 385/16 |
| 5,482,570 A | 1/1996 | Saurer et al. | | |
| 5,489,774 A | 2/1996 | Akamine et al. | | 250/234 |
| 5,493,628 A | 2/1996 | Lawandy | | 385/122 |
| 5,508,881 A | 4/1996 | Stevens | | 361/305 |
| 5,524,011 A | 6/1996 | Lawandy | | 372/22 |
| 5,547,705 A | 8/1996 | Fukuzawa et al. | | 427/162 |
| 5,548,113 A | 8/1996 | Goldberg et al. | | 250/234 |
| 5,585,962 A | 12/1996 | Dixon | | 359/328 |
| 5,589,235 A | 12/1996 | Ogawa | | 428/1 |
| 5,604,635 A | 2/1997 | Lawandy | | 359/620 |
| 5,625,456 A | 4/1997 | Lawandy | | 356/376 |
| 5,689,603 A | 11/1997 | Huth | | 385/131 |
| 5,694,498 A | 12/1997 | Manasson et al. | | 385/15 |
| 5,742,471 A | 4/1998 | Barbee, Jr. et al. | | 361/305 |
| 5,747,861 A | 5/1998 | Dentai | | 257/435 |
| 5,789,742 A | 8/1998 | Wolff | | 250/227.11 |
| 5,796,506 A | 8/1998 | Tsai | | 359/191 |
| 5,862,286 A | 1/1999 | Imanishi et al. | | 385/122 |
| 5,872,422 A | 2/1999 | Xu et al. | | 313/311 |
| 5,888,371 A | 3/1999 | Quate | | 205/122 |
| 5,894,122 A | 4/1999 | Tomita | | 250/234 |
| 5,897,945 A | 4/1999 | Lieber et al. | | 428/323 |
| 5,902,416 A | 5/1999 | Kern et al. | | 136/244 |
| 5,973,444 A | 10/1999 | Xu et al. | | 313/309 |
| 5,994,691 A | 11/1999 | Konada | | 250/234 |
| 6,038,060 A | 3/2000 | Crowley | | 359/328 |
| 6,043,496 A | 3/2000 | Tennant | | 250/492.1 |
| 6,052,238 A | 4/2000 | Ebbesen et al. | | 359/738 |
| 6,083,843 A | 7/2000 | Ohja et al. | | 438/710 |
| 6,096,496 A | 8/2000 | Frankel | | 435/4 |
| 6,100,525 A | 8/2000 | Eden | | 250/338.1 |
| 6,146,196 A | 11/2000 | Burger et al. | | 439/578 |
| 6,146,227 A | 11/2000 | Mancevski | | 445/24 |
| 6,183,714 B1 | 2/2001 | Smalley et al. | | 423/447.3 |
| 6,194,711 B1 | 2/2001 | Tomita | | 250/234 |
| 6,201,242 B1 | 3/2001 | Eden et al. | | 250/332 |
| 6,211,532 B1 | 4/2001 | Yagi | | 257/40 |
| 6,212,292 B1 | 4/2001 | Soares | | 382/141 |
| 6,233,045 B1 | 5/2001 | Suni et al. | | 356/28.5 |
| 6,258,401 B1 | 7/2001 | Crowley | | 427/126.3 |
| 6,271,130 B1 | 8/2001 | Rajh et al. | | 438/677 |
| 6,278,231 B1 | 8/2001 | Iwasaki et al. | | 313/310 |
| 6,310,583 B1 | 10/2001 | Saunders | | 343/786 |
| 6,322,938 B1 | 11/2001 | Cohn | | 430/8 |
| 6,333,458 B1 | 12/2001 | Forrest et al. | | 136/259 |
| 6,365,466 B1 | 4/2002 | Krivokapic | | 438/283 |
| 6,410,935 B1 | 6/2002 | Rajh et al. | | 257/43 |
| 6,415,082 B1 | 7/2002 | Wach | | 385/39 |
| 6,420,647 B1 | 7/2002 | Ji et al. | | |
| 6,445,006 B1 | 9/2002 | Brandes et al. | | 257/76 |
| 6,456,423 B1 | 9/2002 | Nayfeh et al. | | 359/328 |
| 6,472,594 B1 | 10/2002 | Ichinose et al. | | 136/256 |
| 6,514,771 B1 | 2/2003 | Seul | | 436/518 |
| 6,515,274 B1 | 2/2003 | Moskovits et al. | | 250/216 |
| 6,518,494 B1 | 2/2003 | Shibuya et al. | | |
| 6,538,194 B1 | 3/2003 | Koyanagi et al. | | |
| 6,569,575 B1 | 5/2003 | Biebuyck et al. | | 430/5 |
| 6,580,026 B1 | 6/2003 | Koyanagi et al. | | |
| 6,621,079 B1 | 9/2003 | Shao et al. | | 250/306 |
| 6,642,129 B2 | 11/2003 | Liu et al. | | 438/496 |
| 6,657,305 B1 | 12/2003 | Cohen et al. | | 257/773 |
| 6,700,550 B2 | 3/2004 | Crowley | | 343/792.5 |
| 6,724,064 B2 | 4/2004 | Watanabe et al. | | 257/459 |
| 6,740,807 B2 | 5/2004 | Ono | | |
| 6,749,827 B2 | 6/2004 | Smalley et al. | | 423/447.3 |
| 6,756,025 B2 | 6/2004 | Colbert et al. | | 423/447.3 |
| 6,782,154 B2 | 8/2004 | Zhao et al. | | 385/16 |
| 6,824,755 B2 | 11/2004 | Colbert et al. | | 423/447.1 |
| 6,833,162 B2 | 12/2004 | Chattopadhyay et al. | | 427/273 |
| 6,835,534 B2 | 12/2004 | Weiss et al. | | 430/311 |
| 6,838,297 B2 | 1/2005 | Iwasaki et al. | | 438/20 |
| 6,849,797 B2 | 2/2005 | Koyanagi et al. | | |
| 6,849,948 B2 | 2/2005 | Chen et al. | | 257/758 |
| 6,852,920 B2 | 2/2005 | Sager et al. | | |
| 6,864,415 B2 | 3/2005 | Koyanagi et al. | | |
| 6,867,443 B2 | 3/2005 | Liu et al. | | 257/226 |
| 6,878,871 B2 | 4/2005 | Scher et al. | | |
| 6,882,051 B2 | 4/2005 | Majumdar et al. | | 257/746 |
| 6,891,623 B1 | 5/2005 | Baudon et al. | | 356/491 |
| 6,897,158 B2 | 5/2005 | Sharma | | 438/713 |
| 6,913,713 B2 * | 7/2005 | Chittibabu et al. | | 252/501.1 |
| 6,936,233 B2 | 8/2005 | Smalley et al. | | 423/447.1 |
| 6,936,761 B2 | 8/2005 | Pichler | | |
| 6,946,336 B2 | 9/2005 | Pang et al. | | 438/199 |
| 6,946,597 B2 | 9/2005 | Sager et al. | | |
| 6,949,237 B2 | 9/2005 | Smalley et al. | | 423/447.3 |
| 6,969,897 B2 | 11/2005 | Kim, II | | 257/432 |
| 6,979,709 B2 | 12/2005 | Smalley et al. | | 524/495 |
| 6,985,223 B2 | 1/2006 | Drachev et al. | | 356/301 |
| 6,996,147 B2 | 2/2006 | Majumdar et al. | | 372/43 |
| 7,005,378 B2 | 2/2006 | Crocker, Jr. et al. | | 438/674 |
| 7,008,604 B2 | 3/2006 | Smalley et al. | | 423/447.1 |
| 7,013,708 B1 | 3/2006 | Cho et al. | | 73/31.05 |
| 7,019,391 B2 | 3/2006 | Tran | | 257/678 |
| 7,035,498 B2 | 4/2006 | Wu et al. | | 385/16 |
| 7,041,620 B2 | 5/2006 | Smalley et al. | | 502/182 |
| 7,048,903 B2 | 5/2006 | Colbert et al. | | 423/447.1 |
| 7,048,999 B2 | 5/2006 | Smalley et al. | | 428/367 |
| 7,052,666 B2 | 5/2006 | Colbert et al. | | 423/447.1 |
| 7,053,351 B2 | 5/2006 | Li et al. | | 250/201.3 |
| 7,057,832 B2 | 6/2006 | Wu et al. | | 359/811 |
| 7,060,510 B2 | 6/2006 | Bonnell et al. | | 438/3 |
| 7,067,098 B2 | 6/2006 | Colbert et al. | | 423/447.1 |
| 7,068,898 B2 | 6/2006 | Buretea et al. | | 385/123 |
| 7,071,406 B2 | 7/2006 | Smalley et al. | | 136/252 |
| 7,088,003 B2 | 8/2006 | Gates et al. | | 257/774 |
| 7,097,820 B2 | 8/2006 | Colbert et al. | | 423/447.2 |
| 7,099,071 B2 | 8/2006 | Crowley | | |
| 7,105,596 B2 | 9/2006 | Smalley et al. | | |
| 7,115,864 B2 | 10/2006 | Colbert et al. | | 250/306 |
| 7,126,183 B2 | 10/2006 | Forbes et al. | | 257/314 |
| 7,129,567 B2 | 10/2006 | Kirby et al. | | 257/621 |
| 7,132,711 B2 | 11/2006 | Forbes et al. | | 257/314 |
| 7,132,994 B2 | 11/2006 | Crowley | | |
| 7,169,329 B2 | 1/2007 | Wong et al. | | 252/502 |
| 7,195,813 B2 | 3/2007 | Burberry et al. | | |
| 7,205,021 B2 | 4/2007 | Crowley | | |

| | | |
|---|---|---|
| 7,208,793 B2 | 4/2007 | Bhattacharyya .............. 257/314 |
| 7,224,985 B2 | 5/2007 | Caci ............ 455/456.1 |
| 7,233,071 B2 | 6/2007 | Furukawa et al. ............ 257/759 |
| 7,235,736 B1 * | 6/2007 | Buller et al. ............. 136/251 |
| 7,238,415 B2 | 7/2007 | Rodriguez et al. |
| 7,242,073 B2 | 7/2007 | Mosley et al. ............... 257/532 |
| 7,291,782 B2 | 11/2007 | Sager et al. ............. 136/250 |
| 7,301,199 B2 | 11/2007 | Lieber et al. ............. 257/327 |
| 7,411,343 B2 | 8/2008 | Han |
| 7,462,774 B2 | 12/2008 | Roscheisen et al. |
| 7,485,799 B2 * | 2/2009 | Guerra ............ 136/245 |
| 7,511,217 B1 | 3/2009 | Roscheisen et al. |
| 7,589,880 B2 | 9/2009 | Kempa et al. |
| 7,605,327 B2 | 10/2009 | Roscheisen et al. |
| 7,635,905 B2 | 12/2009 | Kim, II |
| 7,754,964 B2 | 7/2010 | Kempa et al. |
| 2001/0001681 A1 | 5/2001 | Zhang et al. .............. 427/508 |
| 2001/0037823 A1 | 11/2001 | Middelman et al. .......... 136/251 |
| 2002/0098135 A1 * | 7/2002 | Smalley et al. .............. 422/198 |
| 2002/0102196 A1 | 8/2002 | Smalley et al. .............. 422/198 |
| 2002/0102201 A1 | 8/2002 | Colbert et al. ............. 423/445 R |
| 2002/0122873 A1 | 9/2002 | Mirkin et al. ............. 427/2.1 |
| 2002/0150524 A1 | 10/2002 | Smalley et al. .............. 422/198 |
| 2002/0159943 A1 | 10/2002 | Smalley et al. ............ 423/447.1 |
| 2003/0021967 A1 | 1/2003 | Sagiv et al. ............. 428/209 |
| 2003/0068432 A1 | 4/2003 | Dai et al. ............. 427/58 |
| 2003/0089899 A1 | 5/2003 | Lieber et al. .............. 257/9 |
| 2003/0122111 A1 | 7/2003 | Glatkowski |
| 2003/0134267 A1 | 7/2003 | Kang et al. ............ 435/4 |
| 2003/0213922 A1 | 11/2003 | Gordon et al. ............ 250/492.1 |
| 2003/0228727 A1 * | 12/2003 | Guerra ............ 438/200 |
| 2004/0075464 A1 | 4/2004 | Samuelson et al. .......... 326/37 |
| 2004/0077156 A1 | 4/2004 | Tsakalakos et al. ......... 438/479 |
| 2004/0095658 A1 | 5/2004 | Buretea et al. |
| 2004/0109666 A1 | 6/2004 | Kim, II ........... 385/147 |
| 2004/0118448 A1 | 6/2004 | Scher et al. |
| 2004/0131843 A1 | 7/2004 | Mirkin et al. ............. 428/327 |
| 2004/0169615 A1 | 9/2004 | Crowley ............ 343/810 |
| 2004/0232321 A1 | 11/2004 | Miles et al. ............. 250/235 |
| 2004/0245209 A1 | 12/2004 | Jung et al. ............ 216/8 |
| 2005/0006623 A1 | 1/2005 | Wong et al. ............ 252/70 |
| 2005/0098204 A1 | 5/2005 | Roscheisen et al. |
| 2005/0181409 A1 | 8/2005 | Park et al. ............. 435/6 |
| 2005/0189480 A1 | 9/2005 | Hollingsworth ............ 250/234 |
| 2005/0191434 A1 | 9/2005 | Mirin et al. ............. 427/457 |
| 2005/0194035 A1 | 9/2005 | Jin et al. ............ 136/252 |
| 2005/0194038 A1 | 9/2005 | Brabec et al. ............. 136/256 |
| 2005/0199894 A1 | 9/2005 | Rinzler et al. ............. 257/94 |
| 2005/0211294 A1 | 9/2005 | Chittibabu et al. ........... 136/263 |
| 2005/0221202 A1 | 10/2005 | Gofron ............ 430/5 |
| 2005/0221577 A1 | 10/2005 | Li et al. ............ 438/401 |
| 2005/0230270 A1 | 10/2005 | Ren et al. ............. 205/777.5 |
| 2005/0243410 A1 | 11/2005 | Bachmann et al. .......... 359/342 |
| 2005/0255237 A1 | 11/2005 | Zhang et al. ............. 427/180 |
| 2005/0272856 A1 | 12/2005 | Cooper et al. ............. 254/496 |
| 2005/0285121 A1 | 12/2005 | Kim, II |
| 2006/0014001 A1 | 1/2006 | Zhang et al. ............. 428/195.1 |
| 2006/0024438 A1 | 2/2006 | Ku et al. ............. 427/237 |
| 2006/0027543 A1 | 2/2006 | Cheng ............ 219/121.69 |
| 2006/0040057 A1 | 2/2006 | Sheehan et al. ............. 427/256 |
| 2006/0043257 A1 | 3/2006 | Cheng et al. ............. 250/201.3 |
| 2006/0054201 A1 | 3/2006 | Pettit ............. 257/116 |
| 2006/0082379 A1 | 4/2006 | Liu et al. ............. 324/754 |
| 2006/0110618 A1 | 5/2006 | Manivannan et al. ........ 428/566 |
| 2006/0112985 A1 | 6/2006 | Hantschel et al. |
| 2006/0158760 A1 | 7/2006 | Portico Ambrosio et al. ............ 359/883 |
| 2006/0174934 A1 | 8/2006 | Sager et al. |
| 2007/0047056 A1 | 3/2007 | Kempa et al. ............. 359/245 |
| 2007/0081242 A1 | 4/2007 | Kempa et al. ............. 359/486 |
| 2007/0105240 A1 | 5/2007 | Kempa et al. ............. 438/3 |
| 2007/0107103 A1 | 5/2007 | Kempa et al. ............. 977/834 |
| 2007/0137697 A1 | 6/2007 | Kempa et al. ............. 136/256 |
| 2007/0138376 A1 | 6/2007 | Naughton et al. ............. 250/216 |
| 2007/0175507 A1 | 8/2007 | Dutta |
| 2007/0181177 A9 | 8/2007 | Sager et al. ............. 136/263 |
| 2007/0186971 A1 | 8/2007 | Lochun et al. |
| 2007/0204902 A1 | 9/2007 | Dutta |
| 2007/0240757 A1 * | 10/2007 | Ren et al. ............. 136/256 |
| 2007/0264488 A1 | 11/2007 | Lee |
| 2007/0281156 A1 | 12/2007 | Lieber et al. ............. 428/373 |
| 2008/0006319 A1 | 1/2008 | Bettge et al. |
| 2008/0072958 A1 | 3/2008 | Dutta |
| 2008/0092953 A1 | 4/2008 | Lee |
| 2008/0276987 A1 | 11/2008 | Flood |
| 2009/0071527 A1 | 3/2009 | Axtell et al. |
| 2009/0107548 A1 | 4/2009 | Guerra |
| 2009/0133751 A1 | 5/2009 | Sreenivasan et al. |
| 2009/0165844 A1 | 7/2009 | Dutta |
| 2009/0183770 A1 | 7/2009 | Nguyen |
| 2009/0194160 A1 | 8/2009 | Chin et al. |
| 2009/0217963 A1 | 9/2009 | Liang et al. |

FOREIGN PATENT DOCUMENTS

| | | |
|---|---|---|
| JP | 57-089212 | 6/1982 |
| WO | WO 03/016901 | 2/2003 |
| WO | WO 2007/025066 | 3/2007 |
| WO | WO 2007/086903 | 8/2007 |
| WO | WO 2008/048232 A2 | 4/2008 |
| WO | WO 2008/048233 A2 | 4/2008 |

OTHER PUBLICATIONS

Balasubramanian et al., *Biosensors Based on Carbon Nanotubes*, Anal. Bioanal. Chem. vol. 385, pp. 452-468, 2006.

Burns, G., *Solid State Physics*, Academic Press Inc., Orlando, pp. 487-489, 1985.

Delzeit et al., *Growth of Carbon Nanotubes by Thermal and Plasma Chemical Vapour Deposition Processes and Applications in Microscopy*, Nanotechnology, vol. 13, pp. 280-284, 2002.

Evident Technologies, Inc., *Quantum Dots in High Efficiency Photovoltaics Using EviDots*, pp. 1-8, Jan. 2006.

Fumeaux et al., *Measurement of the Resonant Lengths of Infrared Dipole Antennas*, Infrared Physics and Technology, vol. 41, pp. 271-281, 2000.

Griggs et al., *P-n Junction Heterostructure Device Physics Model of a Four Junction Solar Cell*, Proceedings of SPIE, vol. 6339, pp. 63390D1-63390-D8, 2006.

Guo et al., *Metal-Insulator-Semiconductor Electrostatics of Carbon Nanotubes*, Applied Physics Letters, vol. 81, No. 8, pp. 1486-1488, Aug. 19, 2002.

Guo et al., *Performance Projections for Ballistic Carbon Nanotube Field-Effect Transistors*, Applied Physics Letters, vol. 80, No. 17, pp. 3192-3194, Apr. 29, 2002.

Heavens, O.S., *Optical Properties of Thin Solid Films*, Dover Publications, Inc., New York, pp. 113-116, 1955.

Huang et al., *Growth of Large Periodic Arrays of Carbon Nanotubes*, Applied Physics Letters, vol. 82, No. 3, pp. 460-462, Jan. 20, 2003.

Jorio et al., *Polarized Resonant Raman Study of Isolated Single-Wall Carbon Nanotubes: Symmetry Selection Rules, Dipolar and Multipolar Antenna Effects*, Physical Review B, vol. 65, pp. 121402-1-121402-4, 2002.

Kayes et al., *Comparison of the Device Physics Principles of Planar and Radial p-n Junction Nanorod Solar Cells*, Journal of Applied Physics, 97 (11), Art. No. 114302, pp. 114302-1-114302-11, 2005.

Kayes et al., *Radial pn Junction Nanorod Solar Cells: Device Physics Principles and Routes to Fabrication in Silicon*, Photovoltaic Specialists Conference 2005, Conference Record of the Thirty-Fifth Proceedings of the IEEE, pp. 55-58, Jan. 3-7, 2005.

Kempa et al., *Photonic Crystals Based on Periodic Arrays of Aligned Carbon Nanotubes*, Nano Letters, vol. 3, No. 1, pp. 13-18, 2003.

Milanovic et al., *A Simple Process for Lateral Single Crystal Silicon Nanowires*, Proceedings of IMECE'02, 2002 ASME International Engineering Congress & Exposition, New Orleans, LA, IMCE 2002-33392, pp. 1-7, Nov. 17-22, 2002.

Moon et al., *Field Theory for Engineers*, D. Van Nostrand Company Inc., Princeton, NJ, pp. 504-509, 1961.

Ren et al., *Synthesis of Large Arrays of Well-Aligned Carbon Nanotubes on Glass*, Science, vol. 282, pp. 1105-1107, Nov. 6, 1998.

Sotiropoulou et al., *Carbon Nanotube Array-Based Biosensor*, Anal. Bioanal. Chem., vol. 375, pp. 103-105, 2003.

Staebler et al., *Reversible Conductivity Changes in Discharge-Produced Amorphous Si*, Applied Physics Letters, vol. 31, No. 4, pp. 292-294, 1977.

Teo et al., *Uniform Patterned Growth of Carbon Nanotubes Without Surface Carbon*, Applied Physics Letters, vol. 79, No. 10, pp. 1534-1536, Sep. 3, 2001.

Terman, F.E., *Radio Engineering*, McGraw-Hill Book Company, New York, Chapter 14, pp. 662-731, 1947.

von Roedern, B. et al., *The Role of Polycrystalline Thin-Film PV Technologies for Achieving Mid-Term Market Competitive PV Modules*, Conference Record of 31$^{st}$ IEEE Photovoltaics Specialists Conference and Exhibition, Lake Buena Vista, FL, Jan. 3-7, 2005.

Wang et al., *Receiving and transmitting Light-Like Radio Waves: Antenna Effect in Arrays of Aligned Carbon Nanotubes*, Applied Physics Letters, vol. 85, No. 13, pp. 2607-2609, Sep. 27, 2004.

Yamamoto, et al., *Photoconductive Coaxial Nanotubes of Molecularly Connected Electron Donor and Acceptor Layers*, Science, vol. 314, pp. 1761-1764, Dec. 15, 2006.

Ambit Corporation Press Release, "AMBIT Corporation Announces Solar Energy Initiative", (4 pages), Apr. 26, 2006 at www.nanotech-now.com/news.cgi?story_id=15038, accessed on Oct. 25, 2007.

Nanotechnology News, "Carbon Nanotube Structures Could Provide More Efficient Solar Power for Soldiers", (3 pages), Oct. 15, 2007 at www.azonano.com/news.asp?newsID=548, accessed on Oct. 25, 2007.

Center for Multifunctional Polymer Nanomaterials and Devices (CMPND), "Polymer Photonics", (6 pages), © 2003 found at www.capce.ohio-state.edu/CMPND/Photonics.htm, accessed on Oct. 25, 2007.

Ago, Hiroki et al. "Composites of Carbon Nanotubes and Conjugated Polymers for Photovoltaic Devices"; Advanced Materials, vol. 11, No. 15, pp. 1281-1285 (1999).

Berland, B. "Photovoltaic Technologies Beyond the Horizon: Optical Rectennas Solar Cell"; National Renewal Energy Laboratory, Final Report, NREL/SR-520-33263 (Feb. 2003).

Crozier, K.B. et al. "Optical antennas: Resonators for local field enhancement", Journal of Applied Physics, vol. 94, No. 7, pp. 4632-4642 (Oct. 1, 2003).

Su, Y.K. et al. "The Red Shift of ZnSSe Metal-Semiconductor-Metal Light Emitting Diodes with High Injection Currents", IEEE Transaction of Electron Devices, vol. 47, No. 7, pp. 1330-1333 (Jul. 2000).

Wang, Y. et al. "Receiving and Transmitting Light-like radio waves: Antenna Effect in Arryas of Aligned Carbon Nanotubes", Applied Physics Letters, vol. 85, No. 13, pp. 2607-2609 (Sep. 27, 2004).

PCT International Search Report based on PCT/US06/32452 dated Jun. 5, 2008.

International Search Report for PCT/US06/13331 dated May 21, 2008.

International Search Report for PCT/US06/33119 dated Sep. 14, 2007.

Terman "Radio Engineering" McGraw-Hill Book Co. NY CH. 14, pp. 662-731, 1947.

Office Action in U.S. Appl. No. 11/509,209 mailed Mar. 6, 2009.
Office Action in U.S. Appl. No. 11/509,209 mailed Oct. 6, 2008.
Office Action in U.S. Appl. No. 11/509,209 mailed Mar. 17, 2008.
Office Action in U.S. Appl. No. 11/509,209 mailed Aug. 20, 2007.
Office Action in U.S. Appl. No. 11/401,606 mailed Sep. 1, 2009.
Office Action in U.S. Appl. No. 11/401,606 mailed Feb. 18, 2009.
Office Action in U.S. Appl. No. 11/401,606 mailed Aug. 29, 2008.

\* cited by examiner

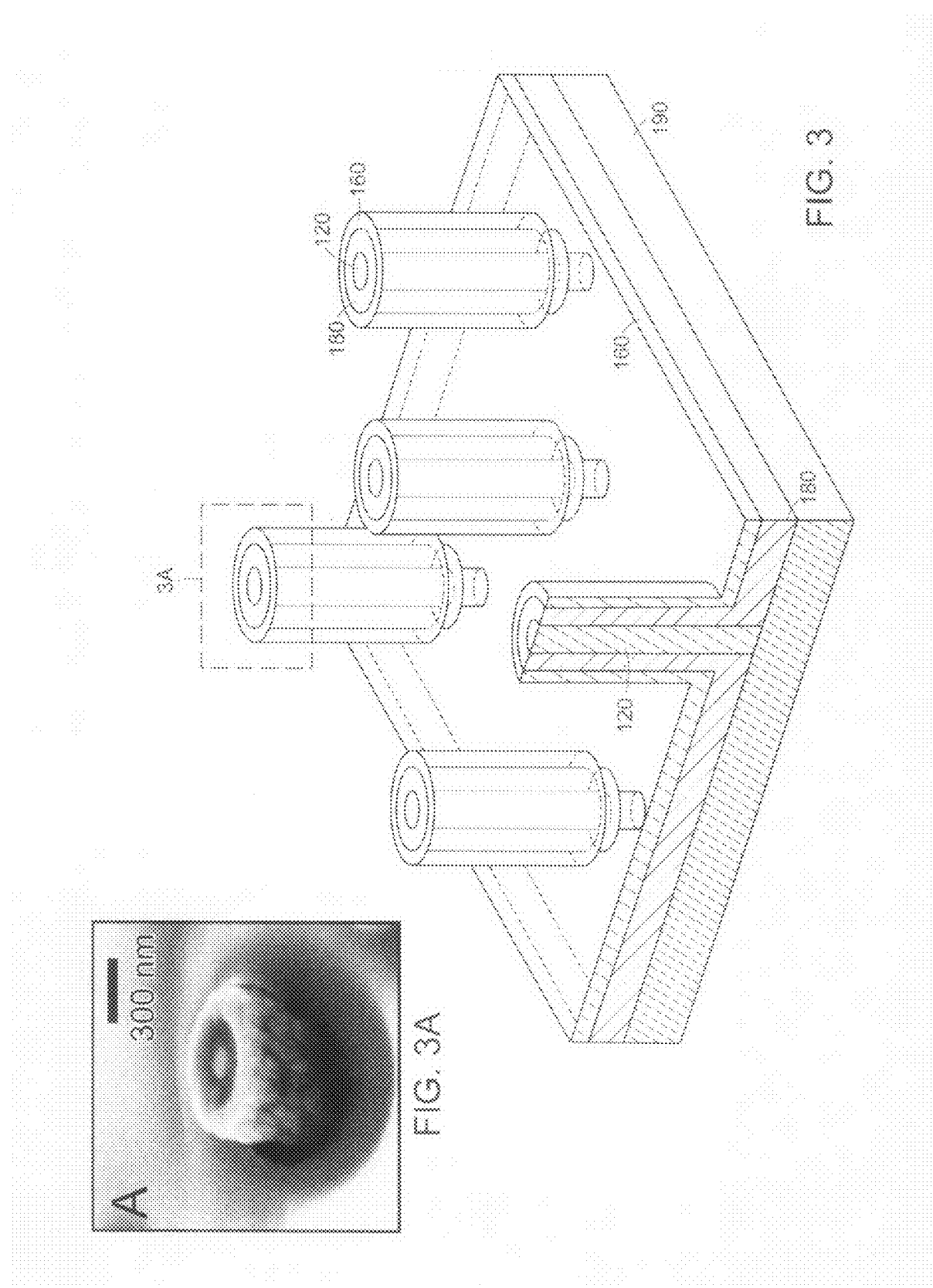

APPARATUS AND METHODS FOR SOLAR ENERGY CONVERSION USING NANOSCALE COMETAL STRUCTURES

RELATED APPLICATIONS

This application is a continuation-in-part of U.S. Ser. No. 11/401,606, filed Apr. 10, 2006, which claims the benefit of U.S. Provisional Application Ser. No. 60/711,004, filed Aug. 24, 2005, and this application also claims the benefit of U.S. Provisional Application Ser. No. 60/799,293, filed May 9, 2006, and the entirety of all these applications are hereby incorporated herein by reference for the teachings therein.

GOVERNMENT SUPPORT

The invention was supported, in whole or in part, by Contract No. DAAD16-02-C-0037 from the U.S. Army Natick Soldier Systems Center. The Government has certain rights in the invention.

FIELD

The embodiments disclosed herein relate to the field of solar energy conversion using nanoscale optics, and more particularly to an apparatus and methods for solar conversion using nanoscale cometal structures, including coaxial and coplanar.

BACKGROUND

Nanoscale optics is the study of optical interactions with matter structured into units of subwavelength (for visible light) dimensions. Nanoscale optics have numerous applications in optical technologies such as nanolithography, high-density optical data storage, photochemistry on a nanometer scale, solar cells, materials imaging and surface modification with subwavelength lateral resolution, local linear and non-linear spectroscopy of biological and solid-state structures, quantum computing and quantum communication.

In general, solar energy can be harvested in two ways: as electricity (solar photovoltaic) and as heat (solar thermal). All extant solar cells are less than 100% efficient, meaning the solar cells convert less than 100% of the incident solar energy to a usable form. At present it appears that, high efficiency solar cells can be achieved only in p-n junction photovoltaic (PV) cells with average aperture-area efficiency (AAE) of about 10-28%, and modules with average AAE of about 17%. In research-grade multijunction concentrators, efficiencies as high as about 39% have been reported. These are based on crystalline semiconductors, which are expensive. For standard crystalline silicon (c-Si) PV technology, not only is the material cost some 50% higher than that of thin film forms, but the cost for installation is high compared to flexible substrate PVs such as those made from amorphous silicon (a-Si). Inexpensive PV cells based on non-crystalline semiconductors have the following AAE's: a-Si about 12%; CdTe (cadmium telluride) about 16%; and CIS (copper indium diselenide) about 19%. See B. von Roedem, K. Zweibel, and H. S. Ullal, "The role of polycrystalline thin-film PV technologies for achieving mid-term market competitive PV modules," 31st IEEE Photovoltaics Specialists Conference and Exhibition, Lake Buena Vista, Fla., Jan. 3-7, 2005.

The fundamental physics behind low efficiency of inexpensive cells is directly related to the difficulty in assuring simultaneously high photon absorption and charge collection efficiencies. This results from the simultaneous requirements of the light incident on a solar cell and the electrons and holes liberated by the interaction of that light with the photovoltaic semiconductor material. That is, the photovoltaic material must be thick enough to absorb the light (in the form of photons), yet thin enough to enable the liberated charge carriers (electrons and holes) to successfully migrate to the edges (top and bottom) to be harvested.

Furthermore, for a-Si-based solar cells, the stabilized efficiency is typically about 15% lower than the initial value due to light-induced metastable defect creation, known as the Staebler-Wronski effect (SWE). D. L. Staebler and C. R. Wronski, "Reversible conductivity changes in discharge-produced amorphous Si," Appl. Phys. Lett. 31, 292-294 (1977). Reducing the thickness and corrugating the surface of the active PV layer can improve efficiency significantly, but the low carrier mobility and lifetime product and the SWE are controlled by the band tails of the localized electronic states in the semiconductors, due to structural disorder. The structural disorder is a fundamental problem for all non-crystalline materials that reduces dramatically the diffusion length of the generated carriers.

Prior art attempts to manufacture solar cells using optical rectennas have had major difficulties in achieving large-scale metallic nanostructures at low cost. Recently, multi-walled carbon nanotubes (MWCNTs) were reported to behave like optical antennas that receive and transmit visible light incident upon them. These nanostructures were shown to be highly metallic with well aligned growth orientation. MWCNTs can also be fabricated at low cost in large scale on most conductive or semiconductive substrates by the well-established plasma-enhanced chemical vapor deposition (PECVD) method without using expensive and time-consuming state-of-the-art technologies, such as electron-beam lithography, which are unscalable but still inevitably being used by most other experimental approaches in this field. Thus, there is a need in the art to create a new class of very efficient and low cost solar cells.

SUMMARY

An apparatus and method for solar conversion using nanoscale cometal structures is disclosed herein. The cometal structures may be coaxial or coplanar.

According to aspects illustrated herein, there is provided a nanoscale optics apparatus for use as a solar cell comprising a plurality of nanoscale cometal structures each comprising a photovoltaic material located between a first electrical conductor and a second electrical conductor.

According to aspects illustrated herein, there is provided a solar cell comprising a plurality of nanoscale coaxial structures each comprising an electrically conducting core contacting a photovoltaic material and coated with an outer electrical conductor layer.

According to aspects illustrated herein, there is provided a solar cell comprising a plurality of nanoscale coplanar structures each comprising a photovoltaic layer located between a first electrically conducting layer and a second electrically conducting layer; wherein light enters the coplanar structure between the first electrically conducting layer and the second electrically conducting layer.

According to aspects illustrated herein, there is provided a method of fabricating solar cells comprising preparing a plurality of nanoscale planar structures; coating a plurality of planar surfaces of the plurality of planar structures with a photovoltaic semiconductor while leaving space between the plurality of planar surfaces; and coating the photovoltaic semiconductor with an outer electrical conductor layer, wherein a portion of the outer electrical conductor layer is located between the planar structures to form coplanar structures.

BRIEF DESCRIPTION OF THE DRAWINGS

The presently disclosed embodiments will be further explained with reference to the attached drawings, wherein like structures are referred to by like numerals throughout the several views. The drawings are not necessarily to scale, the emphasis having instead been generally placed upon illustrating the principles of the presently disclosed embodiments.

FIG. 2A shows a schematic view and an exemplary view of an aligned carbon nanotube. FIG. 2B shows a schematic view and an exemplary view of an aligned carbon nanotube after coating with a photovoltaic material. FIG. 2C shows a schematic view and an exemplary view of an aligned carbon nanotube after coating with a photovoltaic material and an outer conductor material.

FIG. 3 shows an array of nanoscale coaxial transmission lines built around aligned carbon nanotubes. FIG. 3A shows an exposed coaxial structure viewed by a scanning electron microscope (SEM).

FIG. 4A shows the surface topography of the array visible in reflected light with dark spots representing nanoscale coaxial transmission lines. FIG. 4B shows the surface topography of the same array as FIG. 4A visible in transmitted light with bright spots of the illuminating nanoscale coaxial transmission lines. FIG. 4C shows the surface topography of the array as a composition of the reflected light (FIG. 4A) and the transmitted light (FIG. 4B).

Figure 1A:
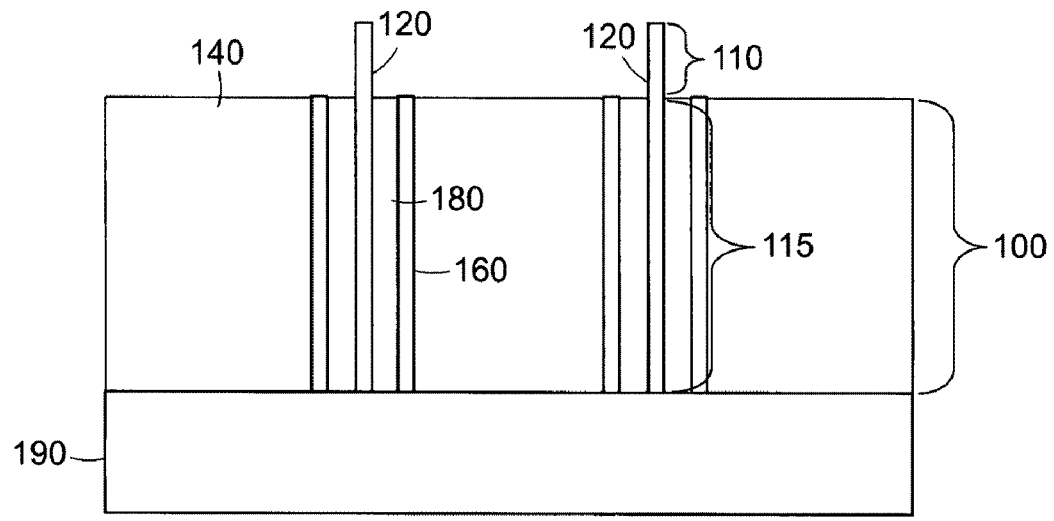
FIG. 1A shows a schematic view of a plurality of nanoscale coaxial cometal solar cell units of the disclosed embodiments embedded in a conductive matrix.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The embodiments disclosed herein relate to the field of solar energy conversion using nanoscale optics, and more particularly to an apparatus and method for solar conversion using nanoscale cometal structures. A solar cell is a device that collects or absorbs solar energy and converts the solar energy into electricity, heat or another usable form. A method of fabricating nanoscale cometal solar cells is also disclosed. The following definitions are used to describe the various aspects and characteristics of the presently disclosed embodiments.

As referred to herein, "carbon nanotube", "nanotube", "nanowire", and "nanorod" are used interchangeably.

As referred to herein, "nanoscale" refers to distances and features below about 5000 nanometers (one nanometer equals one billionth of a meter).

As referred to herein, "single-walled carbon nanotubes" (SWCNTs) include one graphene sheet rolled into a cylinder. "Double-walled carbon nanotubes" (DWCNTs) include two graphene sheets in parallel, and those with multiple sheets (typically about 3 to about 30) are "multi-walled carbon nanotubes" (MWCNTs).

As referred to herein, "single-core coaxial transmission lines" (SCCTL) include one nanotube at the center. A "double-core coaxial transmission lines" (DCCTL) include two nanotubes at the center.

As referred to herein, CNTs are "aligned" wherein the longitudinal axis of individual tubules are oriented in a plane substantially parallel to one another.

As referred to herein, a "tubule" is an individual CNT.

The term "linear CNTs" as used herein, refers to CNTs that do not contain branches originating from the surface of individual CNT tubules along their linear axes.

The term "array" as used herein, refers to a plurality of CNT tubules that are attached to a substrate material proximally to one another.

As referred to herein, a "nanoscale coaxial line" refers to a nanoscale coaxial wire, which includes a plurality of concentric layers. In an embodiment, the nanoscale coaxial line has three concentric layers: an internal conductor, a photovoltaic coating around the core, and an outer conductor. Transmission of electromagnetic energy inside the coaxial line is wavelength-independent and happens in transverse electromagnetic (TEM) mode. In an embodiment, the internal conductor is a metallic core. In an embodiment, the outer conductor is a metallic shielding.

As referred to herein, a "nanoscale coplanar line" refers to a nanoscale coplanar structure, which includes a plurality of parallel layers. In an embodiment, the nanoscale coplanar line has three parallel layers: two metallic conductors, with a photovoltaic coating between them. Transmission of electromagnetic energy inside the coplanar line is wavelength-independent and happens in transverse electromagnetic (TEM) mode.

As referred to herein, "transverse electromagnetic (TEM)" refers to an electromagnetic mode in a transmission line for which both the electric and magnetic fields are perpendicular to the direction of propagation. Other possible modes include but are not limited to transverse electric (TE), in which only the electric field is perpendicular to the direction of propagation, and transverse magnetic (TM), in which only the magnetic field is perpendicular to the direction of propagation.

As referred to herein, a "catalytic transition metal" can be any transition metal, transition metal alloy or mixture thereof. Examples of a catalytic transition metals include, but are not limited to, nickel (Ni), silver (Ag), gold (Au), platinum (Pt), palladium (Pd), iron (Fe), ruthenium (Ru), osmium (Os), cobalt (Co), rhodium (Rh) and iridium (Ir). In an embodiment, the catalytic transition metal comprises nickel (Ni). In an embodiment, the catalytic transition metal comprises iron (Fe). In an embodiment, the catalytic transition metal comprises cobalt (Co).

As referred to herein, a "catalytic transition metal alloy" can be any transition metal alloy. Preferably, a catalytic transition metal alloy is a homogeneous mixture or solid solution of two or more transition metals. Examples of a catalytic transition metal alloy include, but are not limited to, a nickel/gold (Ni/Au) alloy, nickel/chromium (Ni/Cr) alloy, iron/chromium (Fe/Cr) alloy, and a cobalt/iron (Co/Fe) alloy.

The terms "nanotubes," "nanowires," "nanorods," "nanocrystals," "nanoparticles" and "nanostructures" are employed interchangeably herein. These terms primarily refer to material structures having sizes, e.g., characterized by their largest dimension, in a range of a few nanometers (nm) to about a few microns. In applications where highly symmetric structures are generated, the sizes (largest dimensions) can be as large as tens of microns.

The term "CVD" refers to chemical vapor deposition. In CVD, gaseous mixtures of chemicals are dissociated at high temperature (for example, $CO_2$ into C and $O_2$). This is the "CV" part of CVD. Some of the liberated molecules may then be deposited on a nearby substrate (the "D" in CVD), with the rest pumped away. Examples of CVD methods include but are not limited to, "plasma enhanced chemical vapor deposition" (PECVD), "hot filament chemical vapor deposition" (HFCVD), and "synchrotron radiation chemical vapor deposition" (SRCVD).

As referred to herein, an "optical signal" refers to any electromagnetic radiation pulse including gamma rays, X-rays, ultraviolet light, visible light, infrared, microwaves, radio waves (ULF, VLF, LF, MF, HF, long, short, HAM, VHF, UHF, SHF, EHF), cosmic microwave background radiation and other forms of radiation of the electromagnetic spectrum.

The presently disclosed embodiments generally relate to the use of nanoscale cometal lines to fabricate a nanoscale optics apparatus. The nanoscale optics apparatus is a multi-functional nanocomposite material made of a metallic film having a top surface and a bottom surface and a plurality of cometal structures. The nanoscale coaxial line comprises a metallic cylinder, filled with a photovoltaic material and having a central, concentric metallic core. Each nanoscale coaxial line can have the central core extending beyond a surface of the film and an embedded portion that is within the film. The nanoscale coplanar line comprises metallic walls, with the intervening space filled with a photovoltaic material. Each nanoscale coplanar line can have a wall extending beyond a surface of the film and an embedded portion that is within the film.

A cometal structure is a structure wherein two or more, but typically two, metal surfaces are in close proximity, in such a way that transverse electromagnetic (TEM) waves are efficiently propagated in the space in between the two metals. The metals or their surfaces can be composed of the same or different metal materials. Some of these metals could be transparent to the guided radiation. The cometal transmission line might also admit other modes of propagation, for example transverse electric (TE) or transverse magnetic (TM) modes. A conventional example of a cometal structure is a coaxial wire or cable. A nanoscale cometal structure is a structure wherein the separation distance between any two metals in the cometal structure is nanoscale, whereby nanoscale is in the range from about 1 nm to about a few thousand nanometers. The two primary examples of a nanoscale cometal structure are a nanoscale coaxial wire and a nanoscale coplanar transmission line. Both of these cometal structures, and variants thereof, are capable of transmitting waves via the TEM mode, including waves whose wavelengths are smaller than the metal separation distances (i.e., subwavelength propagation). Finite length cometal structures enable standing waves, and act as radiation resonators. By virtue of the nanoscale dimensions, such waves include those in and near the visible spectrum, that is, from the ultraviolet (between about 200 nm and about 400 nm) to the infrared (between about 800 nm and about 5000 nm).

Efficiency of the coupling of the external radiation to the cometal structures depends on the geometry of the structure and the mode of operation. Some cometal structures, e.g. the coplanar structures shown in FIGS. 14-16 and 20-22, couple to the radiation without any arrangements, even for the inter-electrode separations much smaller than the wavelength. In other structures, such as the nanoscale coaxial line, no arrangements are required for sufficiently large external diameters, equal or greater than the wavelength. If the inter-electrode channel is much smaller than the radiation wavelength (i.e., only a TEM mode can propagate), special arrangements, such as an antenna, may be necessary.

The presently disclosed embodiments increase harvesting efficiencies for photons and charge carriers by using a conductive medium, an elementary unit including a nanoantenna impedance matched to a nanoscale coaxial line filled with a photovoltaic-active medium. While the nanoantenna provides efficient light collection, the nanoscale cometal section traps the collected radiation, and assures its efficient conversion into electron-hole pairs. For the nanoscale coaxial embodiment, the coaxial symmetry yields high harvesting efficiency for both photons and charge carriers because it is efficient at conveying the TEM mode of electromagnetic radiation. The nanoscale coaxial line length can be made several microns long to assure high photon harvesting, and the nanoscale coaxial line width can be easily made small enough in diameter to provide high carrier harvesting between internal and external electrodes. The coaxial line allows for subwavelength propagation, and thus a very small distance between electrodes. In fact, the distance between electrodes may be less than the carrier diffusion length without hampering the light propagation (i.e. nanoscale). The nanoscale coplanar embodiment is also efficient at conveying the TEM mode of electromagnetic radiation, and so yields high harvesting efficiency for both photons and charge carriers.

Figures 12A, 12B:
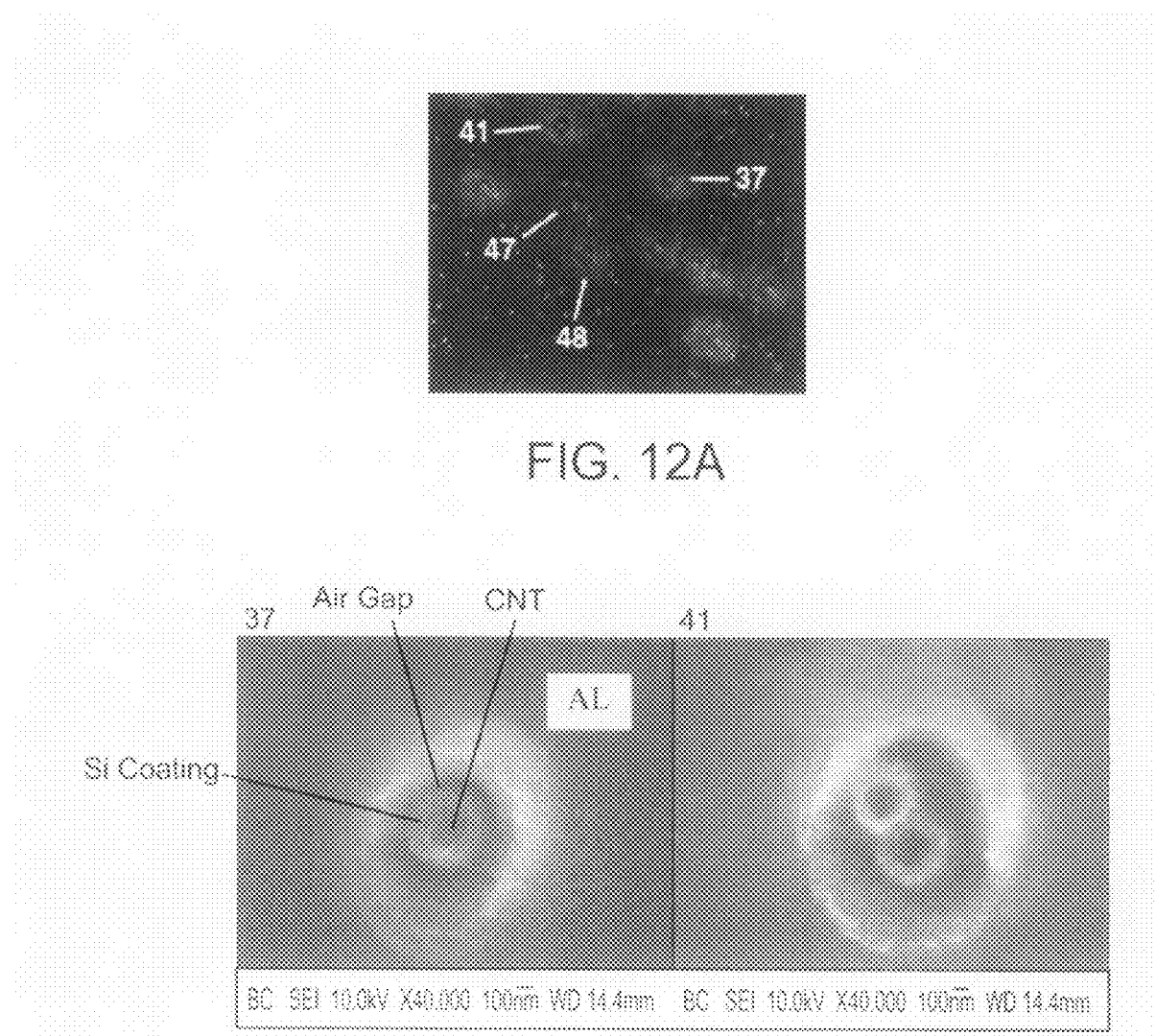
FIG. 12A shows visible and SEM images (overlayed) of a section of a nanoscale optics apparatus made in accordance with the presently disclosed embodiments.
FIG. 12B shows scanning electron microscopy (SEM) images of the nanoscale optics apparatus of FIG. 12A.

The presently disclosed embodiments work with any transmission line capable of transverse electromagnetic (TEM) transmission. Such lines include, but are not limited to, the coaxial transmission line (i.e., a coaxial line with a single core), the multi-core coaxial transmission line (multi-core coax), such as shown in FIG. 12B, view 41, a stripline, and a coplanar line. A stripline is a transmission line having two flat parallel metallic electrodes (strips), separated by a film of a photovoltaic. The width L of each electrode is larger than the radiation wavelength. The electrodes are distance d apart, which can be smaller than the radiation wavelength. In an embodiment, a nanoscale coaxial line with a plurality of cores (multi-core) can be used to yield high harvesting efficiency for both photons and charge carrier. In an embodiment, a nanostripline (i.e., a stripline for visible light, which has d in the nanoscale) yields high harvesting efficiency for both photons and charge carriers.

Antennae are external resonators. The nanoantennas of the presently disclosed embodiments are broad resonators having large aspect ratios, that is their length l is much larger than their diameter d: for example, l>3d. The bandwidth of the nanoantenna can be tuned to cover the entire solar spectrum. The nanoantennas described herein possess the directional characteristics of conventional antennas, proving that conventional, radio technology applies to the nanoscale optics systems in the visible frequency range.

The performance of the system of the presently disclosed embodiments will be comparable to that of c-Si, without its disadvantages, such as high material and installation costs. The system of the presently disclosed embodiments allows for even further improvements. With a multi-layer strategy, the photon energy can be matched to the semiconductor band gap, minimizing phonon losses, and further improving efficiency FIG. 1A shows a schematic view of a nanoscale optics apparatus 100 including a plurality of nanoscale coaxial structures. The nanoscale coaxial structure includes an internal conductor 120 with an impedance-matched antenna 110 and a coaxial section 115 coated with a photovoltaic material 180. The nanoscale optics apparatus 100 is supported by a substrate 190. The internal conductor 120 extends beyond the nanoscale coaxial structure forming the optical nano-antenna 110. An outer conductor 160 is an external coating of the coaxial section 115. A plurality of nanoscale coaxial structures are embedded in a conductive matrix 140. The nanoscale coaxial structure may be a nanoscale coaxial solar cell. The nanoscale optics apparatus is made in accordance with the presently disclosed embodiments.

The internal conductor 120 may be a metallic core. Examples of metals for the internal conductor include but are not limited to, carbon fiber; carbon nanotube; pure transition metals such as nickel (Ni), aluminum (Al), or chromium (Cr); metal alloys, e.g. stainless steel (Fe/C/Cr/Ni) or aluminum alloys (Al/Mn/Zn); and metallic polymers. Other internal conductors are highly doped semiconductors, and semi-metals (metals with vanishingly small band gap, e.g. graphite). Those skilled in the art will recognize that the internal conductor may be other conducting materials known in the art and be within the spirit and scope of the presently disclosed embodiments.

The photovoltaic material 180 has a band gap to maximize the absorption of light in the visible spectrum. Examples of photovoltaic materials include, but are not limited to silicon (Si), cadmium telluride (CdTe), indium gallium phosphide (InGaP), gallium arsenide (GaAs), germanium (Ge), Cu(InGa)Se, GaP, CdS, indium antimonide (InSb), lead telluride (PbTe), In1-x GaxN, organic semiconductors (e.g., copper phthalocyanine (CuPc)), dielectric materials, and similar materials known to those skilled in the art. The photovoltaic materials can be crystalline (periodic arrangement of atoms in macroscopic scale), polycrystalline (periodic arrangement of atoms in microscopic scale), or amorphous (aperiodic arrangement of atoms in macroscopic scale). Those skilled in the art will recognize that the photovoltaic material may be other materials known in the art having a band gap so as to improve the absorption of light in the visible spectrum. The photovoltaic material 180 may be uniform around the internal conductor 120 or the photovoltaic material 180 may surround the internal conductor 120 in a non-uniform manner.

The outer conductor 160 may be a metal. Thus, the outer conductor 160 may take the form of a metallic cylinder. Examples of outer conductors include but are not limited to, carbon fiber; carbon nanotube; pure transition metals such as nickel (Ni), aluminum (Al), or chromium (Cr); metal alloys e.g. stainless steel (Fe/C/Cr/Ni) or aluminum alloys (Al/Mn/Zn); and metallic polymers. Other internal conductors are highly doped semiconductors, and semi-metals (metals with a vanishingly small band gap, e.g. graphite). Those skilled in the art will recognize that the outer conductor may be other conducting materials known in the art and be within the spirit and scope of the presently disclosed embodiments.

Figure 1B:
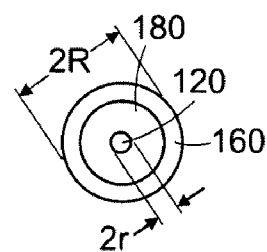
FIG. 1B shows a top view of a nanoscale coaxial solar cell unit of FIG. 1A.

FIG. 1B shows a top view of a nanoscale coaxial solar cell of FIG. 1A. In FIG. 1B, the diameter of the internal conductor 120 is 2r while the diameter of the outer conductor 160 is 2R. Those skilled in the art will recognize that the diameters can vary and be within the spirit and scope of the presently disclosed embodiments.

Figure 2A:
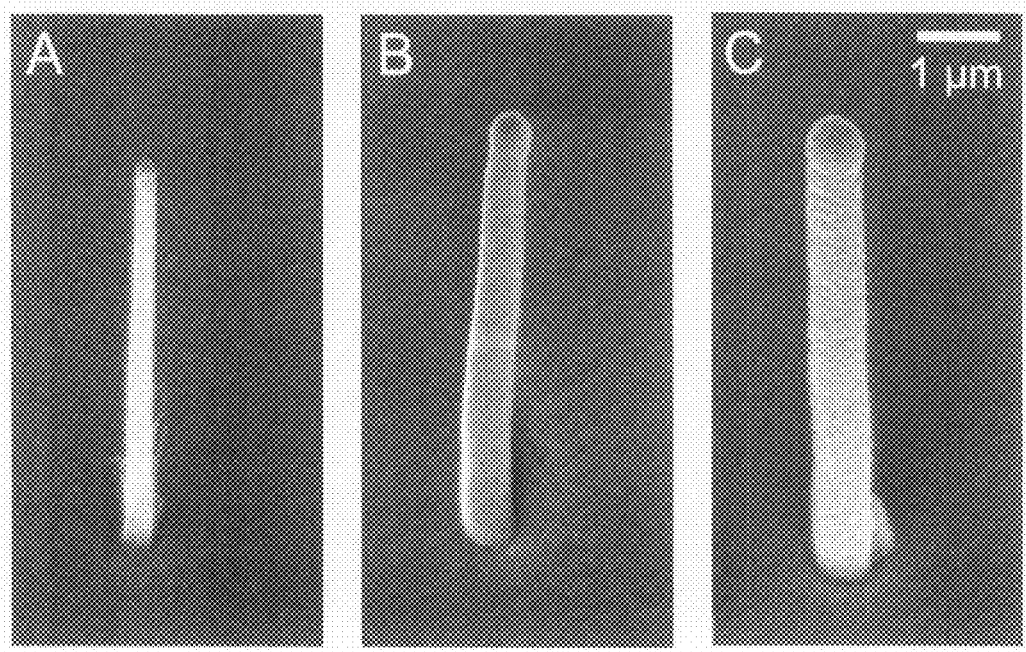
FIG. 2A, FIG. 2B, and FIG. 2C each show a schematic view and an exemplary view of a nanoscale coaxial transmission line built around an aligned carbon nanotube.
Figure 2A:
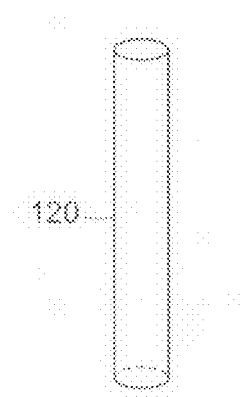
Figure 2B:
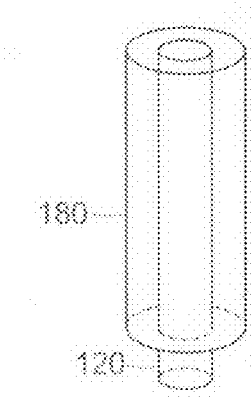
Figure 2C:
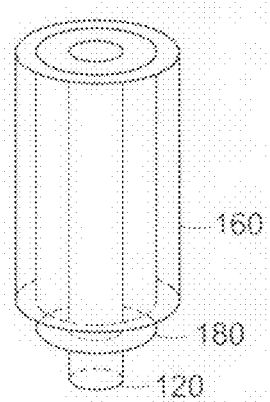

FIG. 2A, FIG. 2B, and FIG. 2C each show a schematic view and an exemplary view of a nanoscale coaxial transmission line built around aligned carbon nanotube. FIG. 2A, FIG. 2B, and FIG. 2C show a single nanoscale coaxial structure selected from an array having a plurality of nanoscale coaxial structures. The schematic views show the three major steps for fabricating nanoscale coaxial solar cells. The exemplary views were taken using a scanning electron microscope (SEM) at a 30 degree angle to the sample surface.

FIG. 2A shows a schematic view and an exemplary view of an aligned carbon nanotube. The plasma-enhanced chemical vapor deposition (PECVD) method was used to grow vertically aligned, multiwalled, straight carbon nanotubes with an average length of about 5-6 μm using a nickel catalyst (FIG. 2A). The catalyst was electrodeposited on a thin chromium layer (about 10 nm) sputtered on the top of a glass substrate.

FIG. 2B shows a schematic view and an exemplary view of an aligned carbon nanotube after coating with a photovoltaic material. The nanotubes were coated with a photovoltaic layer of aluminum oxide ($Al_2O_3$). The photovoltaic layer has a thickness between about 100 nm to about 150 nm or thicker.

FIG. 2C shows a schematic view and an exemplary view of an aligned carbon nanotube after being coated with a photovoltaic material and an outer conductive material. The nanotubes were sputtered with about 100 nm to about 150 nm thick chromium layer as the outer conductor. In an embodiment, the outer conductor is thicker than 150 nm.

FIG. 3 shows an array of nanoscale coaxial transmission lines built around aligned carbon nanotubes. The array may have nanoscale coaxial transmission lines distributed uniformly or randomly on a substrate 190. The nanoscale coaxial transmission lines may be aligned in rows or unevenly distributed on the substrate 190. The substrate 190 may be transparent. The substrate 190 may be composed of a polymer, glass, ceramic material, carbon fiber, glass fiber or combinations thereof. Those skilled in the art will recognize that the substrate may be other materials known in the art and be within the spirit and scope of the presently disclosed embodiments.

An array of vertically aligned conductors (e.g., multiwalled carbon nanotubes or other nanowires/nanofibers) are grown or attached to the substrate. Next, the conductors are coated with appropriate photovoltaic or photovoltaic material. The conductors are then coated with the metallic layer acting as the outer conductor.

An array of nanoscale coaxial transmission lines includes vertically aligned carbon nanotubes grown on glass substrate coated with a thin (about 10 nm) chromium layer. On this layer nickel catalyst for PECVD growth of nanotubes was deposited electrochemically. Then, nanotubes were coated with 150 nm of aluminum oxide and subsequently with 100 nm of chromium. The entire array of nanoscale coaxes was filled with spin-on-glass (SOG) which does not affect array functionality but allowed the top part of the nanoscale coaxes to be mechanically polished off. This way nanoscale coaxial cores could be exposed and they can work as wavelength-independent transmission lines. FIG. 3A shows an exposed coaxial structure viewed by a scanning electron microscope (SEM).

Figure 3C:
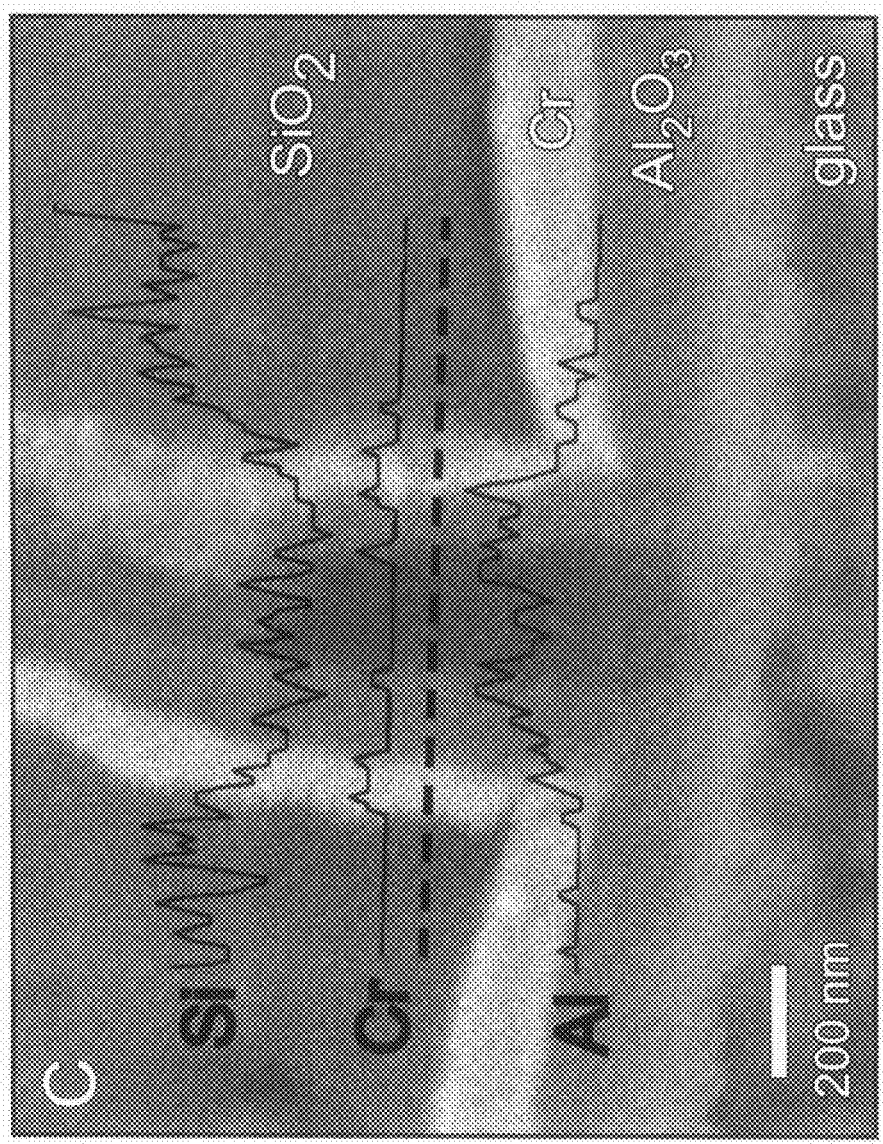
FIG. 3C shows an energy dispersive x-ray spectroscopy (EDS) analysis of the composition of the coaxial layers showing concentration mapping for silicon (Si), chromium (Cr), and aluminum (Al).
Figure 3B:
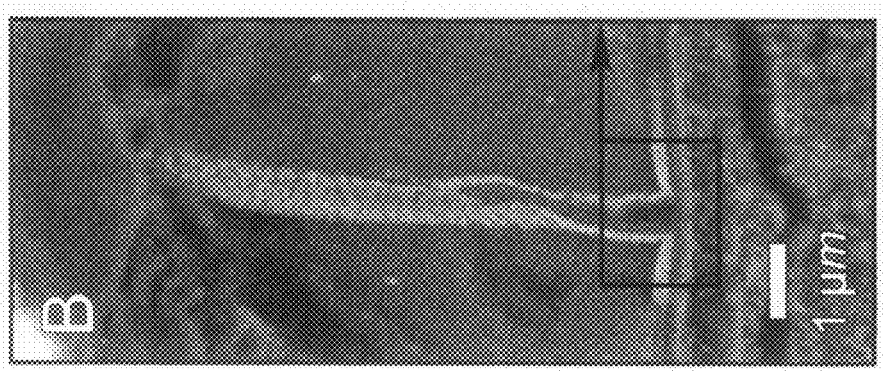
FIG. 3B shows a cross-section view of a single nanoscale coaxial transmission line viewed by a scanning electron microscope.

FIG. 3B shows a cross-section view of a single nanoscale coaxial transmission line viewed by a scanning electron microscope. FIG. 3B shows the internal structure of the nanoscale coaxial transmission line after polishing and being exposed.

FIG. 3C shows an energy dispersive x-ray spectroscopy (EDS) analysis of the composition of the coaxial layers showing concentration mapping for silicon (Si), chromium (Cr), and aluminum (Al). The dotted line in FIG. 3C corresponds to the position of the EDS linescan while three presented plots correspond to silicon (Si), chromium (Cr), and aluminum (Al) concentration along the scanned line. FIG. 3C shows that the concentration of silicon is highest in the silica ($SiO_2$) rich area. Similarly, highest chromium concentration is present in the region of metallic coating of nanoscale coaxial walls, and highest aluminum concentration is observed in the area of photovoltaic coating ($Al_2O_3$).

Figure 3D:
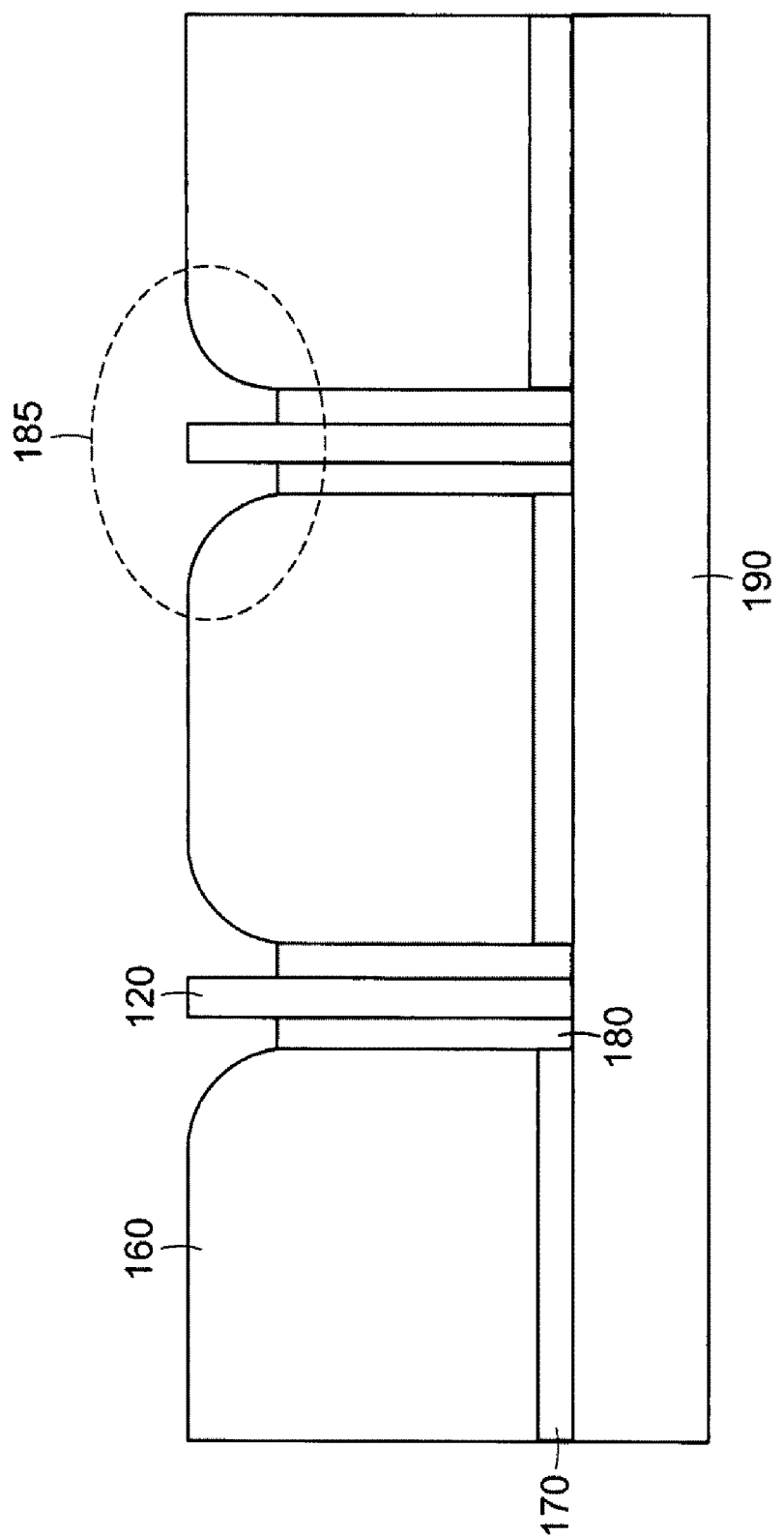
FIG. 3D shows a cross sectional view of an array of nanoscale coaxial solar cells with a concentrator.

FIG. 3D shows a cross sectional view of an array of nanoscale coaxial solar cells with a concentrator, a concave indentation of the outer conductor around the nanoscale coax. The substrate is flexible. In an embodiment, the substrate 190 is aluminum (Al) foil, or other flexible metallic materials (copper, carbon fiber, steel, and similar materials). The substrate is coated with catalytic particles (e.g. Fe, Ni, Co) using wet chemical and electrochemical methods or conventional vacuum deposition techniques (e.g., sputtering, evaporation and similar techniques). Next, internal conductors 120 that are nanotubes are grown using techniques described herein (e.g., CVD, PECVD, and similar techniques), and the substrate area is exposed to oxygen, which affects only the exposed metallic substrate forming a photovoltaic layer 170. The thin film of semiconductor material 180 is grown using conventional deposition techniques (e.g. CVD and similar techniques). Finally, the substrate area is coated with a soft metallic layer 160 with appropriate wetting property against the photovoltaic coating 180 such that a concentrator 185 is formed. The concentrator 185 is a concave meniscus adjacent to the coated internal conductors 120. In an embodiment, the metallic powder or liquid will be used to fill the inter-core spacing, followed by a thermal processing to form the concentrator 185. The concave meniscus region around each nanoscale coaxial unit acts as a light concentrator 185, an additional antenna collecting light from much larger area than the nanoantenna itself. The concentrators 185 allow the entire solar cell array to be fabricated with lower number of nanoscale coaxial units, while still maintaining very high efficiency. The concentrators 185 can be simply added to the solar cell array using techniques known in the art.

In an embodiment, the concentrator 185 self-forms in a conductive medium that poorly wets the surface of a semiconductor-coated nanoscale coaxial cores. A low-wetting metallic medium (e.g., a metallic powder or a liquid containing metallic particles) is deposited as the outer conductor 160, and thermal processing is used to control the wetting angle, i.e. the curvature of the concentrator 185. This will create the light concentrator 185, a convex depression around each nanoscale coaxial core.

Figure 4A:
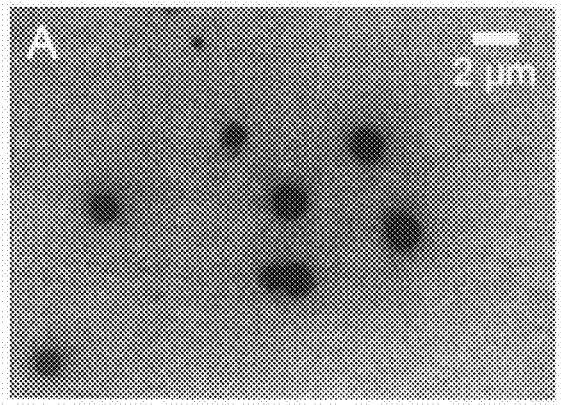
FIG. 4A, FIG. 4B, and FIG. 4C show the results of optical experiments where white light was transmitted through an array of nanoscale coaxial transmission lines.
Figure 4B:
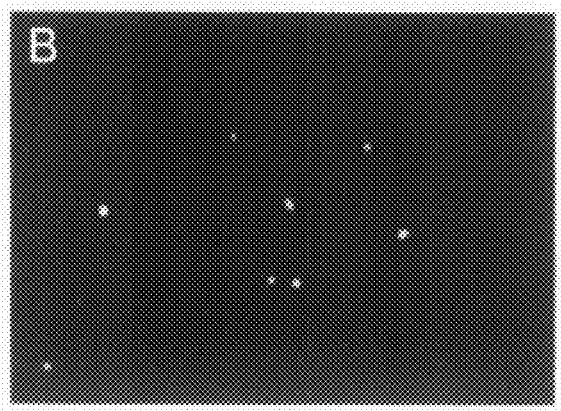
Figure 4C:
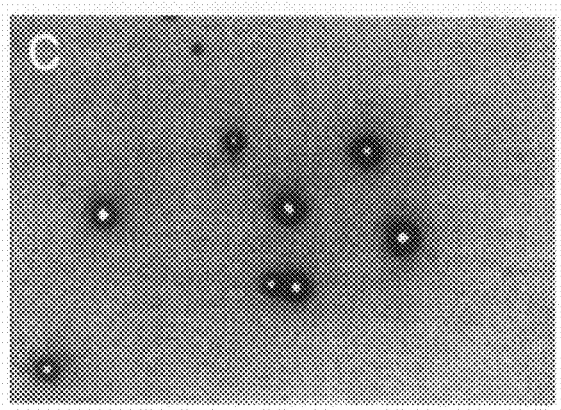

FIG. 4A, FIG. 4B, and FIG. 4C show the results of optical experiments where white light was transmitted through an array of nanoscale coaxial transmission lines. FIG. 4A shows the surface topography of the array visible in reflected light with dark spots representing nanoscale coaxial transmission lines. FIG. 4B shows the surface topography of the same array as FIG. 4A visible in transmitted light with bright spots of the illuminating nanoscale coaxial transmission lines. FIG. 4C shows the surface topography of the array as a composition of the reflected light (FIG. 4A) and the transmitted light (FIG. 4A). There is a very good correlation between position of spots in illuminating nanoscale coaxial transmission lines both FIG. 4A and FIG. 4B. The transmitted light remains white (FIG. 4B), which suggest no cut-off frequency and wavelength independent transmission.

Figure 5:
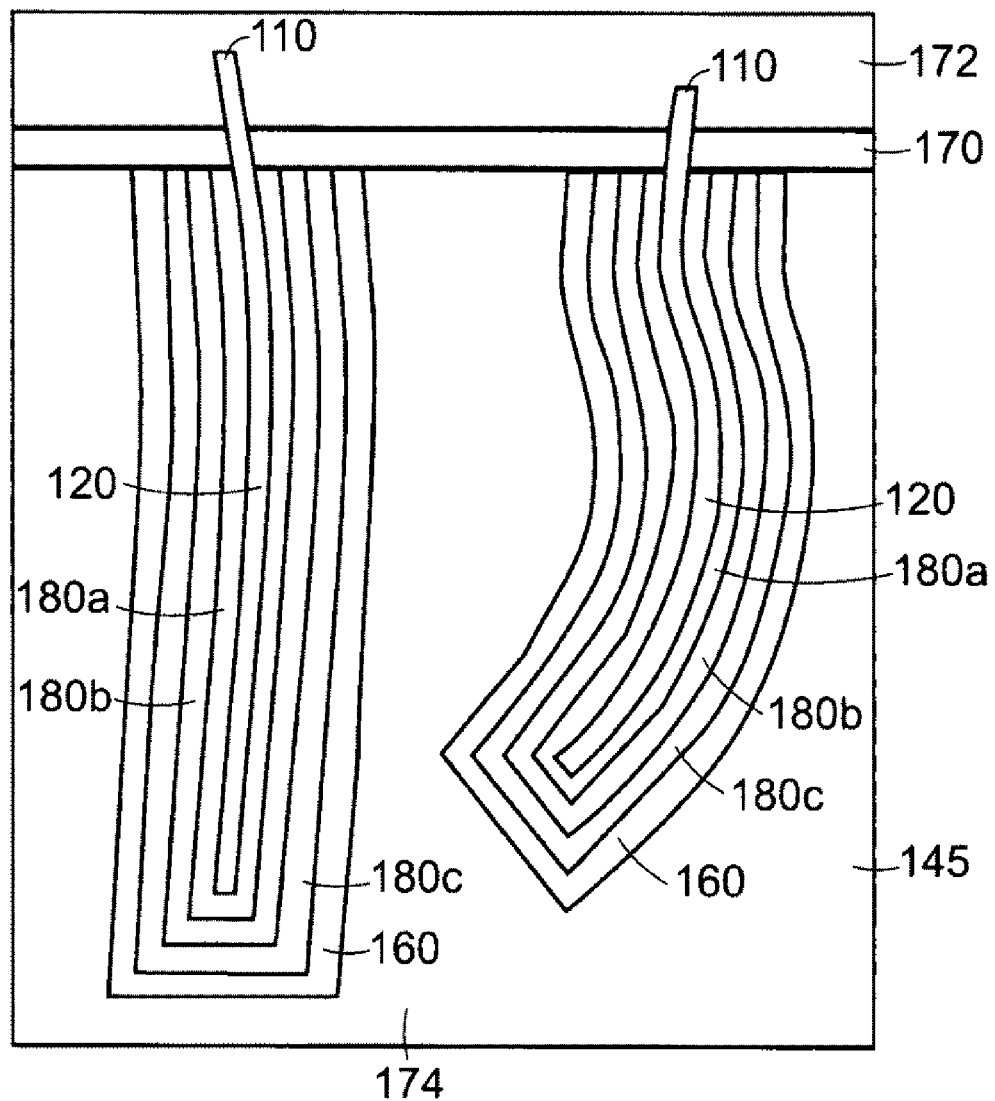
FIG. 5 shows a cross sectional view of nanoscale coaxial solar cells having non-straight conducting lines and a flexible matrix.

The nanoscale coaxial structures of the presently disclosed embodiments can be used as low-cost building blocks for mass scale fabrication of solar cell units. Solar cells could include non-aligned conductors produced in mass scale as nanoscale coaxial cores. FIG. 5 shows a cross sectional view of an embodiment of nanoscale coaxial solar cells having non-straight conductors and a flexible matrix. The non-straight conductors are not aligned with respect to adjacent conductors. Non-straight conductors can be used with any highly conductive nanotubes, nanowires, nanofibers or similar structures.

An example of non-straight conductors can be carbon nanotubes grown by thermal-CVD (chemical vapor deposition) technique. The internal conductor could be then chemically multi-coated with appropriate semiconductors of desired bandgaps and eventually metallized to finalize the coaxial structure. FIG. 5 illustrates the non-straight conductor. Non-straight conductors 120, multicoated with semiconductors 180a, 180b, 180c of appropriate bandgaps, and metallized on the surface with the outer conductor 160 are embedded into a conductive and flexible medium 145 (e.g., conductive paint or polymer). The protruding section 110 is exposed (e.g., by etching) and a thin layer of photovoltaic material 170 is deposited in the top of this structure. Then, a second, transparent conductor (e.g., indium tin oxide or another conductive polymer) is applied. A first contact 172 is adjacent to protruding sections 110 and above the photovoltaic layer 170. A second contact 174 is adjacent to the end of the internal conductor 120 opposite the protruding section 110, and the second contact 174 is in the conductive medium 145. In an embodiment, antenna sections would be non-aligned, randomly positioned, randomly tilted, and with various lengths. The non-straight and randomly positioned nanoscale coaxial transmission lines would dramatically improve collection efficiency by capturing the incoherent and broadband, unpolarized solar radiation.

Figures 6A, 6B:
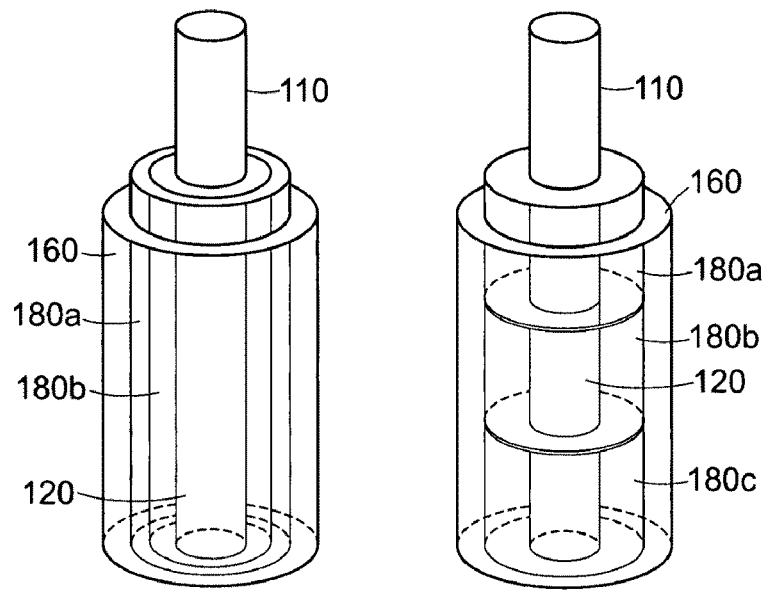
FIG. 6A shows a front perspective view of a nanoscale coaxial solar cell having multilayered structure of different bandgap semiconductors arranged in parallel layout.
FIG. 6B shows a front perspective view of a nanoscale coaxial solar cell having a multilayered structure of different bandgap semiconductors arranged in serial layout.

In an embodiment, semiconductors having different bandgaps are used inside the nanoscale coaxial section to improve photon absorption efficiency. Better matching the semiconductor bandgap with incoming photon energy, yields improved energy conversion efficiency of nanoscale coax-based solar cells. The photovoltaic material can be deposited along the internal conductor in a parallel configuration (FIG. 6A) or a serial configuration (FIG. 6B). FIG. 6A shows a front perspective view of a nanoscale coaxial solar cell having multilayered structure of different bandgap semiconductors 180a, 180b arranged in parallel layout. FIG. 6B shows a front perspective view of a nanoscale coaxial solar cell having multilayered structure of different bandgap semiconductors 180a, 180b, 180c arranged in serial layout. Semiconductors having different bandgaps results in more efficient photon absorption because the various energies of collected photons would be better matched with the semiconductor bandgaps.

Figure 7:
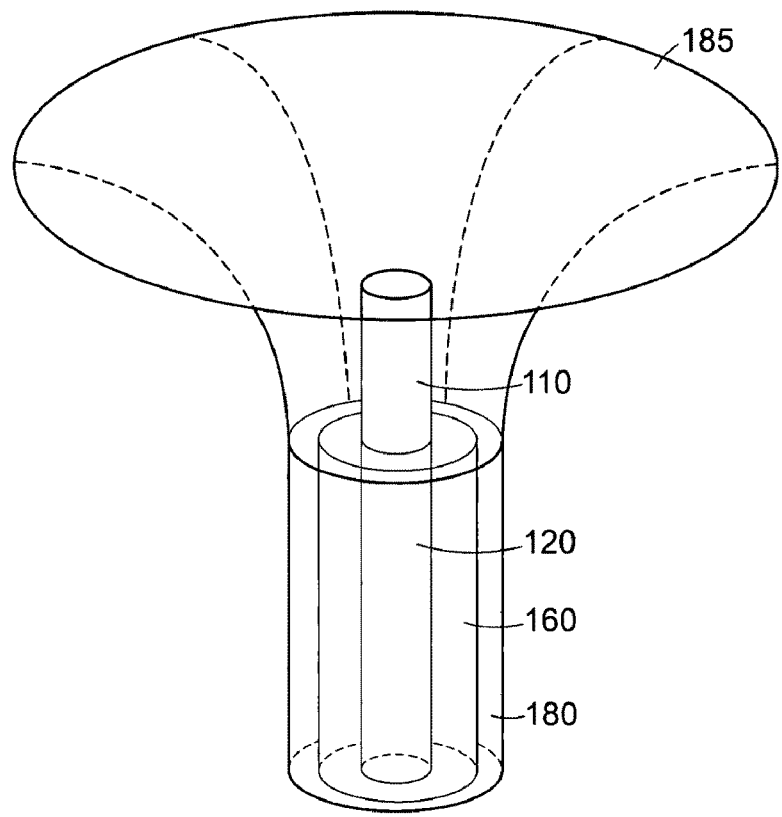
FIG. 7 shows a front perspective view of a nanoscale coaxial solar cell with a concentrator extending from a top end of the nanoscale coaxial solar cell.

In an embodiment, a concentrator 185 extends from a top end of the nanoscale coaxial solar cell to enhance photon collection efficiency. FIG. 7 shows a front perspective view of a nanoscale coaxial solar cell with the concentrator 185 extending from a top end of the nanoscale coaxial solar cell. The concentrator 185 is a conical section extending from a top end of the nanoscale coaxial wire for improved photon collection. The concentrator 185 is a horn antenna, and could have variety of shapes known in the microwave technology art. The concentrator 185 may have shapes including but not limited to parabolically sloped walls or straight, conical walls or similar shapes. The concentrator 185 may be metallic. The concentrator 185 may be fabricated from any highly conductive material including but not limited to a metal, metal alloy, highly doped semiconductor, conductive polymer and other conductive materials. The concentrator 185 could be an integral part of the outer conductive layer of each nanoscale coax.

The concentrator 185 could be an attachment fabricated separately on the top of the nanoscale coax. The concentrator 185 can be implemented by employing a "non-wetting" conductive medium that would poorly wet the surface of a semiconductor-coated nanoscale coaxial cores to create a convex depression around each nanoscale coaxial core, as shown in FIG. 3D.

A method of fabricating a solar cell comprises coating a substrate with a catalytic material; growing a plurality of carbon nanotubes as internal cores of nanoscale coaxial units on the substrate; oxidizing the substrate; coating the substrate with a photovoltaic film; and filling with a metallic medium that wets the photovoltaic film of the nanoscale coaxial units.

A nanoscale coaxial solar cell can be fabricated using the method outlined below or similar methods. A flexible, metallic substrate such as a aluminum (Al) foil is coated with catalytic material (e.g., Ni) by any suitable technique including but not limited to wet chemical deposition, electro-chemical deposition, CVD, sputtering, evaporation and similar techniques. The processed substrate is used for a catalytic growth of carbon nanotubes or any other suitable nanorods/nanowires as internal conductors and cores of nanoscale coaxial units. The growth of the nanotubes can be performed by any appropriate technique including CVD or PECVD and similar techniques. After growing of the nanotubes, the remaining exposed surface of the substrate, i.e. the area free of nanotubes/nanowires, is oxidized to fabricate the photovoltaic layer between the substrate and the outer conductor. Then, the entire system can be coated with a photovoltaic layer by any suitable technique (e.g. CVD, electro-chemical deposition, and similar techniques), and eventually filled with a metallic medium (e.g. tin (Sn) powder). The metallic medium should be selected and processed to obtain a weak wetting contact between the metallic medium and the outer conductor of the nanoscale coax. The metallic medium can be deposited by any conventional technique, e.g. spraying, painting, spin-coating, CVD, evaporation, sputtering, and similar techniques.

The presently disclosed embodiments generally relate to the use of nanoscale coaxial transmission lines (NCTL) to fabricate a nanoscale optics apparatus. The nanoscale optics apparatus is a multifunctional nano-composite material made of a metallic film having a top surface and a bottom surface and a plurality of cylindrical channels filled with a photovoltaic material. An array of nanorods penetrate the metallic film through the plurality of cylindrical channels. The array of nanorods has a protruding portion that extends beyond a surface of the metallic film and an embedded portion that is within the metallic film. The protruding portion acts as a nano-antenna and is capable of receiving and transmitting an electromagnetic radiation at a visible frequency. The embedded portion acts as a nanoscale coaxial transmission line (CTL) and allows for propagation of external radiation with a wavelength exceeding the perpendicular dimensions of the nanorod.

The nanoscale optics apparatus can concentrate light, and therefore enhance a field up to about $10^3$ times. The array of optical nano-antennas, with nano-CTL embedded in a metallic film, effectively compresses light into nanoscopic dimensions. The nano-antennas are capable of receiving and transmitting electromagnetic radiation at the visible frequencies. The extreme compression of light in the nano-CTL leads to an asymmetric tunneling of electrons between the electrodes of the nano-CTL, and thus provides a rectifying action at the light frequencies, and thus conversion of the light into a direct current (DC) voltage. This property leads to a new class of efficient, and low cost rectenna solar cells. The extreme compression of light in the nano-CTL is quick, and is not limited by the usual parasitic capacitances that make the conventional diode rectification inefficient, if not impossible, at the light frequencies.

Figure 8:
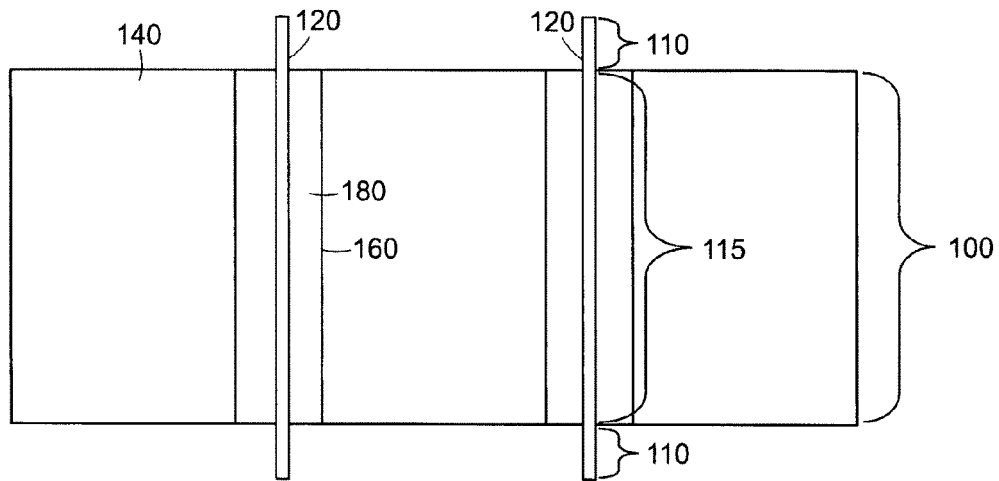
FIG. 8 shows a schematic image of a nanoscale optics apparatus that includes an array of carbon nanotubes, each tubule in the array includes portions that protrude from a metallic film, known as an optical nano-antenna, and a portion that is embedded within the metallic film, known as a nanoscale coaxial transmission line.

FIG. 8 shows a schematic image of a nanoscale optics apparatus 100 synthesized in accordance with the presently disclosed embodiments. The nanoscale optics apparatus 100 has an array of metallic nanorods 120 that penetrate a metallic film 140 through cylindrical channels 160 filled with a photovoltaic material 180. Each nanorod 120 has an optical nano-antenna 110 that protrudes from each surface of the metallic film, and a nanoscale coaxial transmission line (CTL) 115 that is embedded within the metallic film.

Figure 9A:
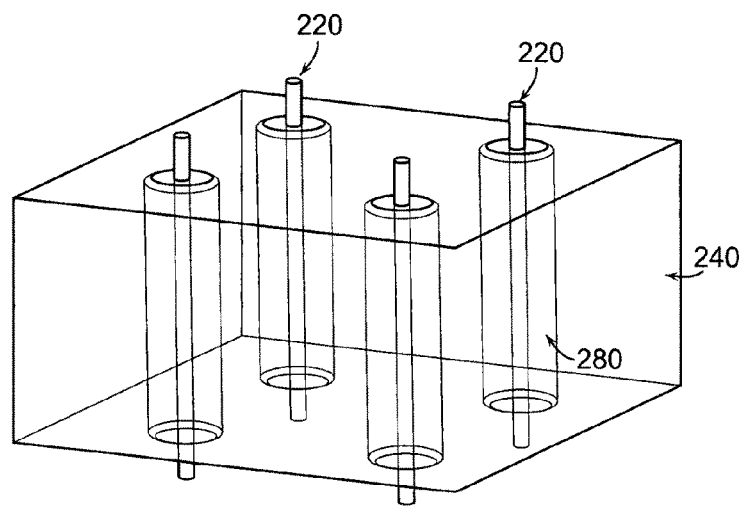
FIG. 9A shows a three-dimensional configuration of a nanoscale optics apparatus in accordance with the presently disclosed embodiments.

FIG. 9A shows a three-dimensional image of a basic structure configuration of a nanoscale optics apparatus 200 synthesized in accordance with the presently disclosed embodiments. Nanorods 220 extending beyond a metallic film 240 act as nano-antennas 110, capable of receiving and transmitting an electromagnetic radiation at the visible frequencies. The incoming light, collected by an array of the optical nano-antennas 110, is compressed into nanoscopic channels of the coaxial transmission lines (cables) 115, and is subsequently decompressed (and reemitted) on the opposite side of the film by the nano-antenna 110 segments. The nano-antennas 110 possess the directional characteristics of conventional antennas, proving that conventional, radio technology applies to the nanoscale optics apparatus 200 in the visible frequency range. The conventional coaxial cables for light may also be developed. An advantage of using the nanoscale coaxial cables 115 is that they do not have a cut-off frequency (in contrast to waveguides), i.e. the nanoscale coaxial cables 115 allow for propagation of radiation with wavelength exceeding their perpendicular dimensions. The purpose of using the nanoscale coaxial cables 115 in the nanoscale optics apparatus 200 is to channel, and compress the external radiation into the confined space between the internal and external electrodes. The degree of this compression can be estimated as follows. A matched antenna collects radiation from an area of the order of $\lambda^2$. Subsequently, this radiation energy can be efficiently transferred into the coaxial transmission line, where it compresses into an area of $\pi(R^2-r^2)$, thus the power compression factor is of the order of $\lambda^2/\pi(R^2-r^2)$. By employing nanorods 120 with a radius $r\approx 5$ nm, and using a perpendicular dimension $R\approx 20$ nm, the power compression factor of the order of several hundreds in the visible range is possible.

The electric field inside the coaxial line varies as $1/\rho$, where $\rho$ is the radial distance from the center, and thus can be made very large for small r. It can be shown, that the electric field enhancement is of the order of $\lambda/\rho$, and thus is of the order of about one hundred in the visible range at the nanorod 220 with $r\approx 5$ nm. An additional, dramatic field enhancement can be achieved by using nanorods 220 with active plasmon resonances in the range of operation, e.g. gold or silver. Calculations show that there is an additional, resonant enhancement by factor as high as $10^4$ due to the plasmon (Mie) resonances. The total field enhancement can be expected to be as high as $10^6$ to $10^7$, and therefore high enough to trigger nonlinear processes in the photovoltaic of the coaxial cable, leading to the desired switching-off the transmitted electromagnetic energy. To illustrate the effect, consider a modest enhancement of $10^5$, achievable with the plasmonic nanorods 220. The corresponding field intensity is about 2 V/μm for an incoming flux of 1 W/m$^2$, which is about 1000 times smaller than that of a typical laser pointer. Such field intensities are sufficient to cause a field emission from typical nanorods 220.

Figure 9B:
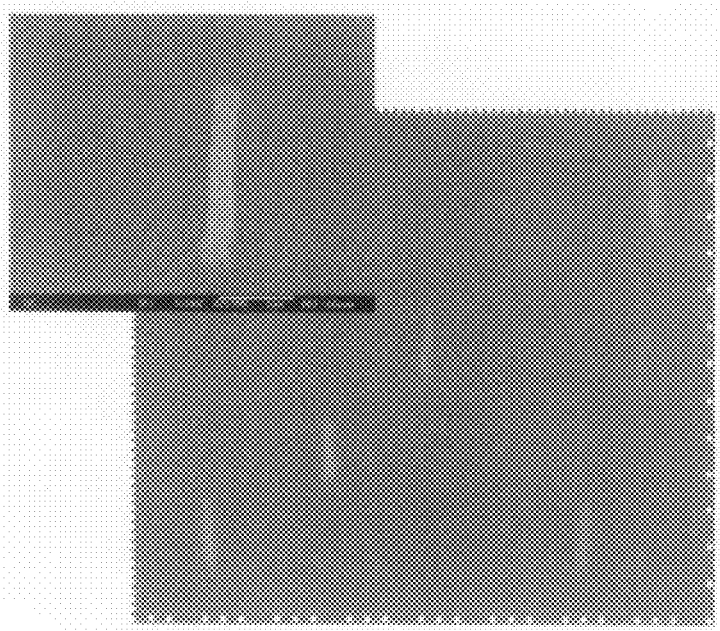
FIG. 9B shows a scanning electron microscope (SEM) image of the nanorods used in the nanoscale optics apparatus of FIG. 9A.
Figure 9C:
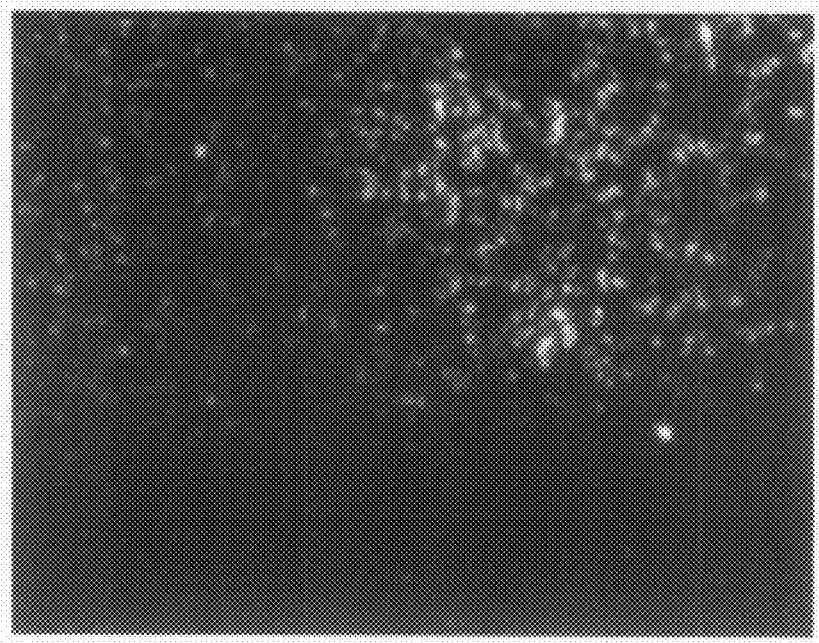
FIG. 9C shows a transmission optical microscope image of the nanoscale optics apparatus of FIG. 9A.

FIG. 9B shows a scanning electron microscope image showing the relative characteristics of the nanorods 220 of FIG. 9A. The nanorods 220 are aligned linearly in the nanoscale optics apparatus 200. FIG. 9C shows a transmission electron microscopy image of the nanoscale optics apparatus 200 of FIG. 9A. In the nanoscale optics apparatus 200 of FIG. 9A, only the top half of the nanoscale optics apparatus 200 was etched during fabrication, the bottom half was not etched. This results in just the top half portion having transmitted light, as seen in the transmission optical microscopy image of FIG. 9C.

Figure 10A:
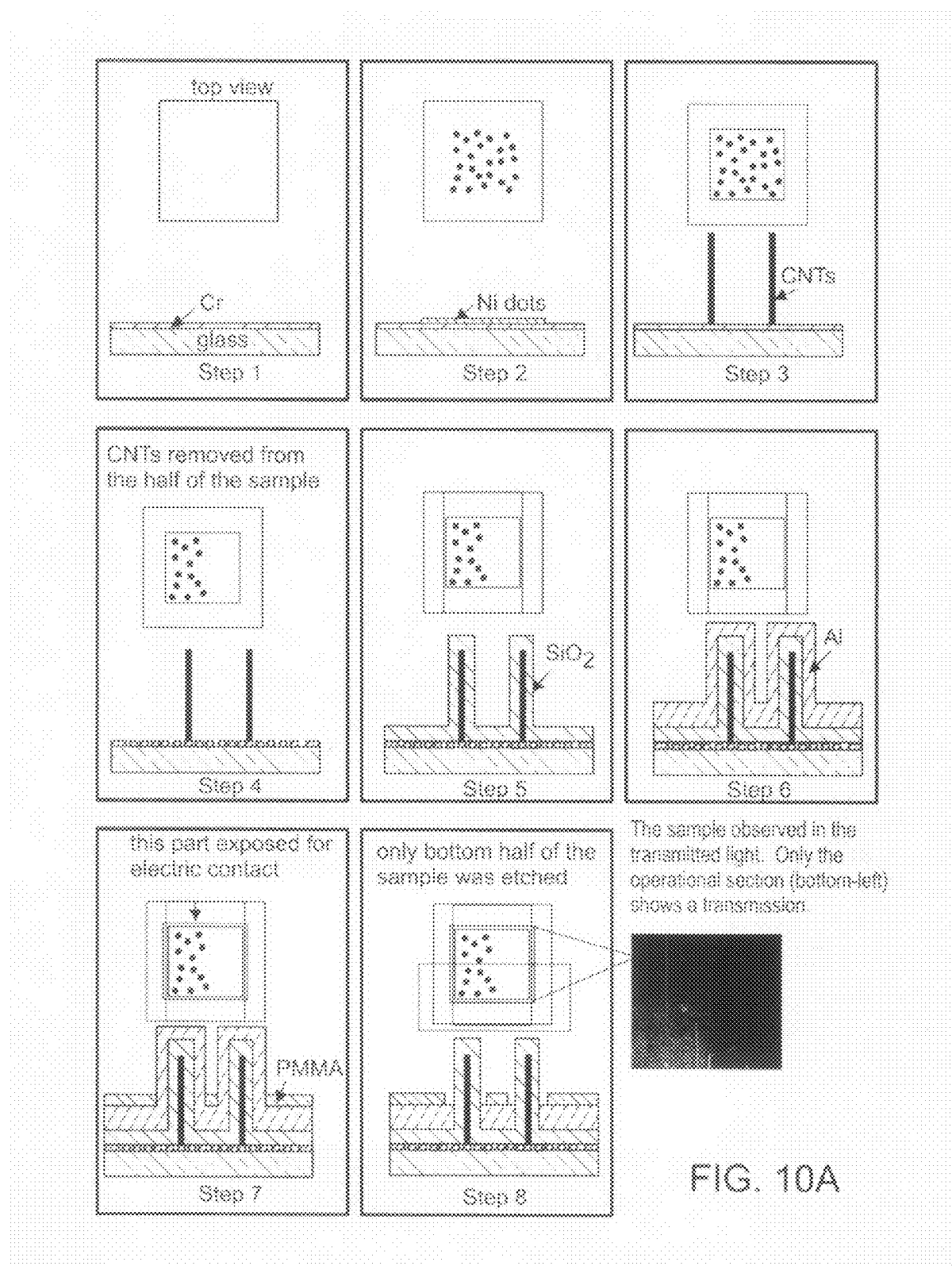
FIG. 10A illustrates a method for making a nanoscale optics apparatus in accordance with the presently disclosed embodiments.

FIG. 10A shows an exemplary method for making the nanoscale optics apparatus 100. In step 1, chromium is sputtered onto a glass substrate, typically at a thickness of about 15 nm. A selected thickness of catalytic transition metal (for example nickel) is electrodeposited onto the chromium glass followed by carbon nanotube growth, as shown in steps 2 and 3. Plasma enhanced chemical vapor deposition (PECVD) is used to etch the chromium layer, as shown in step 4. Typical PECVD lasts about an hour. A photovoltaic (or semiconductor) material (for example $SiO_x$, where $0 \leq x \leq 2$) is sputtered on the substrate, as shown in step 5. Those skilled in the art will recognize that the sputtered material may be made of any material having a specific function as required by an application of the nanoscale optics apparatus and still be within the scope and spirit of the presently disclosed embodiments. Typically, the photovoltaic material is coated to yield a thickness of about 100 nm. Aluminum is then sputtered followed by spin-coating of polymethylmethacrylate (PMMA) and baking at about 180° C. for about 40 min, as shown in steps 6 and 7. Typically, about 400 nm of aluminum is sputtered. In step 8, electrochemical etching of the aluminum layer on the tips of the nanorods 120 is accomplished at about 25 min in about 20% $H_2SO_4$, 4.0V, sample as anode, a platinum electrode as cathode. In this example, only the bottom half of the sample was etched, resulting in just that portion having transmitted light, as seen in the transmission electron microscopy image.

Figure 10B:
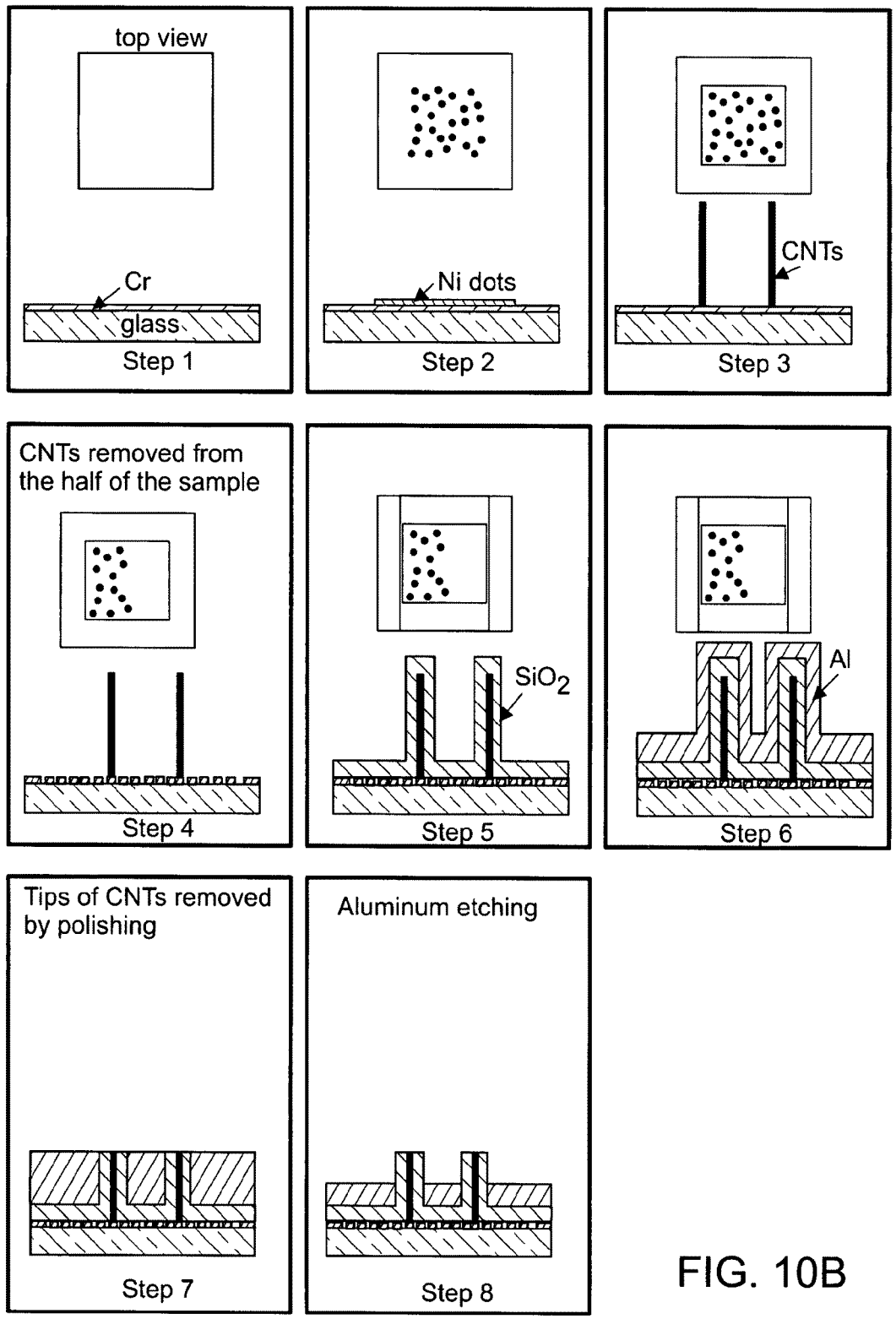
FIG. 10B illustrates a method for making a nanoscale optics apparatus in accordance with the presently disclosed embodiments.

FIG. 10B shows an alternative method for making the nanoscale optics apparatus 100. In step 1, chromium is sputtered onto a glass substrate, typically at a thickness of about 15 nm. A selected thickness of catalytic transition metal (for example nickel) is electrodeposited onto the chromium glass followed by carbon nanotube growth, as shown in steps 2 and 3. Plasma enhanced chemical vapor deposition (PECVD) is used to etch the chromium layer, as shown in step 4. Typical PECVD lasts about an hour. A photovoltaic (or semiconductor) material (for example $SiO_x$, where $0 \leq x \leq 2$) is sputtered on the substrate, as shown in step 5. Those skilled in the art will recognize that the sputtered material may be made of any material having a specific function as required by an application of the nanoscale optics apparatus and still be within the scope and spirit of the presently disclosed embodiments. Typically, the photovoltaic material is coated to yield a thickness of about 100 nm. Aluminum is then sputtered onto the coated substrate, as shown in step 6. Typically, about 400 nm of aluminum is sputtered. In step 7, the tips of the nanotubes are removed by polishing. In step 8, electrochemical etching of the aluminum layer on the tips of the nanorods 120 is accomplished at about 25 min in about 20% $H_2SO_4$, 4.0V, sample as anode, a platinum electrode as cathode.

Figure 11:
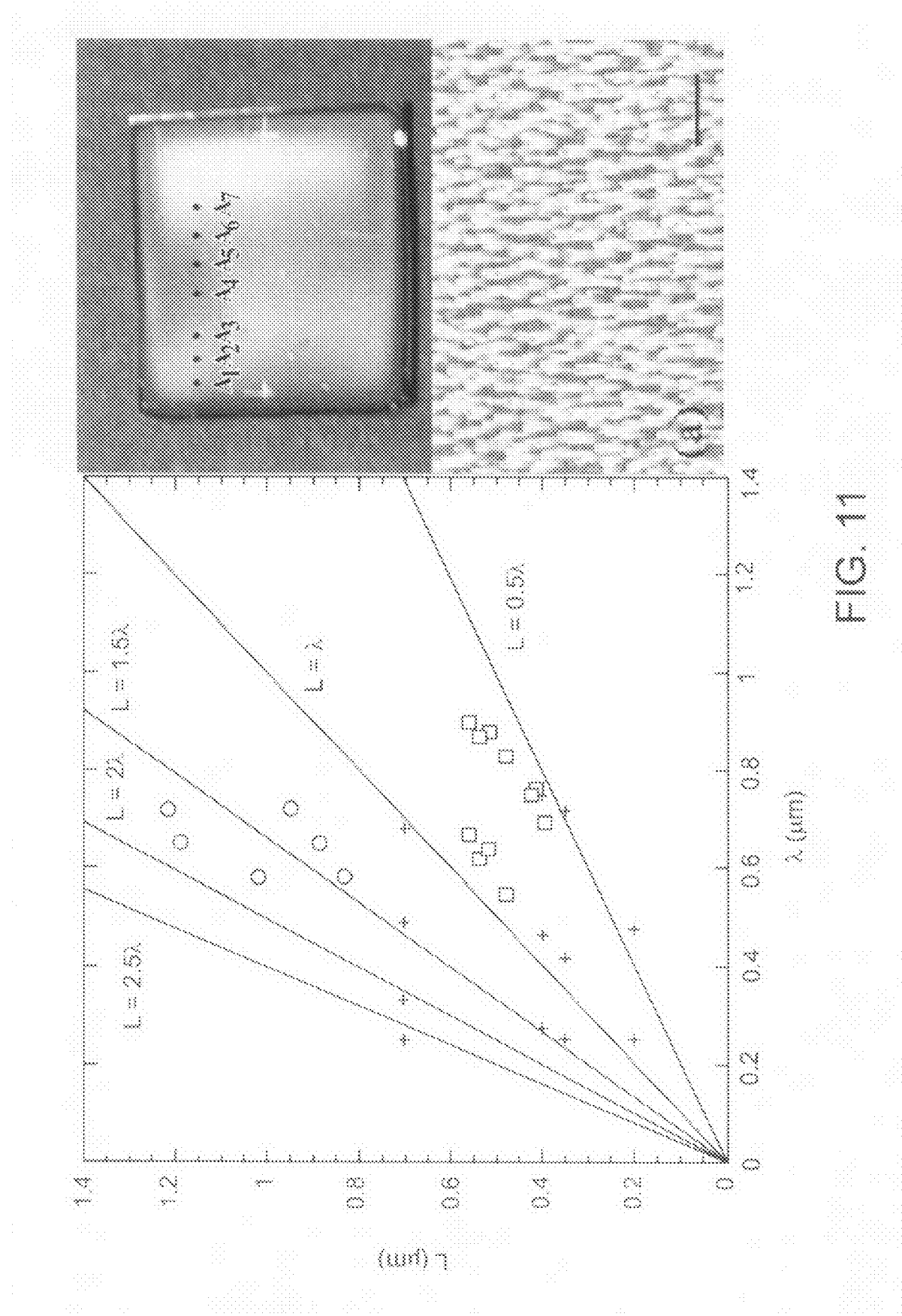
FIG. 11 shows a graph of nano-antenna length versus radiation wavelength, at a maximum radar cross section (RCS) scattering amplitude.

FIG. 11 shows results demonstrating the antenna action of an array of nanorods 120 in the visible frequency range. Both, the polarization, as well as, the nano-antenna length effects are shown in the radar cross section (RCS) type of experiment, in which an external radiation is reflected/scattered by an aperiodic array of nanorods 120, in excellent agreement with antenna theory. The main section shows the nano-antenna length versus radiation wavelength, at a maximum RCS scattering amplitude. The upper right image in FIG. 11 shows an image of the sample with interference colors (from left to right) due to gradually changing nanorod 120 length. The lower right image in FIG. 11 shows the scanning electron microscope image of the nanorods 120.

FIG. 12A shows a visible image of a section of a nanoscale optics apparatus 100 made in accordance with the presently disclosed embodiments. The nano-CTLs 115 have been illuminated from behind with green and red lasers. Both green and red light is guided through the nano-CTLs 115. Each active nano-CTL 115 is surrounded by a green halo. Smaller red light spots are also visible. FIG. 5B shows the corresponding SEM close-up (top view) of the numbered nano-CTLs 115. Nano-CTL number 37 and number 47 are single core, while number 41 and number 48 are double core. Nano-CTL number 37 comprises a CNT core, coated with Si, located coaxially inside a cylindrical canal penetrating an Al film. An air gap (the dark ring) separates the Si coated CNT from the Al wall. As seen in FIG. 12B, the air gap is much thinner (~100 nm) than the wavelength of the radiation (~550 nm for green and 650 nm for red). Thus, the subwavelength action of the nano-CTL has been demonstrated.

Figure 13:
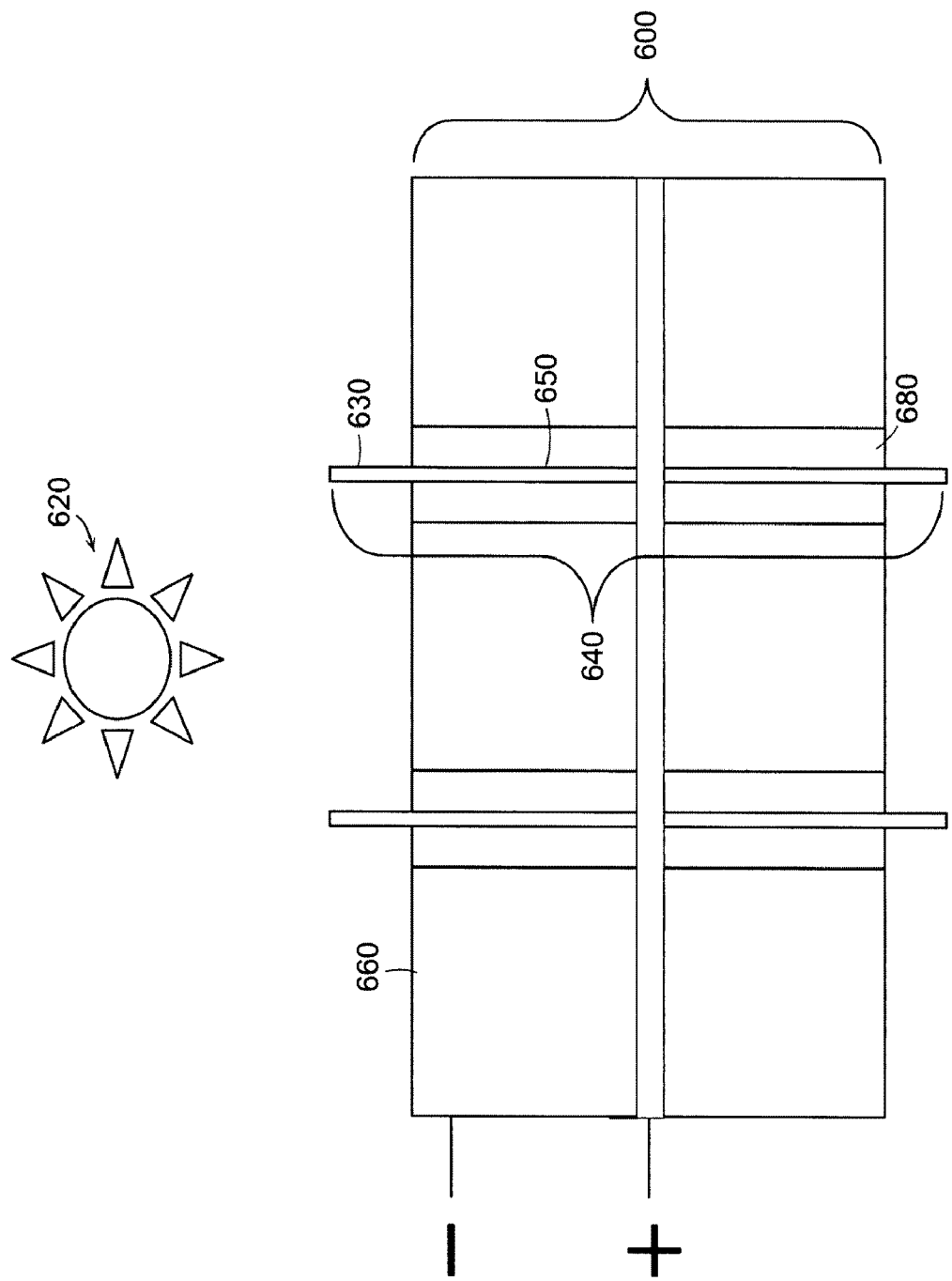
FIG. 13 shows a schematic image of a solar cell made in accordance with the presently disclosed embodiments.

In an embodiment, the nanoscale optics apparatus can be used as a solar cell as shown in FIG. 13. The asymmetric inter-electrode electron tunneling in the nano-CTLs (shown generally at 650) is the rectifying mechanism for a solar cell battery 600. The tunneling is asymmetric since the maximum field is always at the inner electrode. Thus the electrons tunnel from the inner to the outer electrode. The photovoltaic 680 (semiconductor) can reduce band offsets at the metal-photovoltaic interfaces. This will eliminate any charge accumulation in the photovoltaic, and thus will make the field induced band bending, and the resulting tunneling a quick process. The solar radiation 620 enters the nano-CTLs 650 via a nanoantenna segment 630 of a nanorod 640. A sufficiently large field will trigger the tunneling resulting in negative charge accumulation on the outer electrodes. The inner electrodes can be connected providing the positively charged battery terminal.

Figure 14:
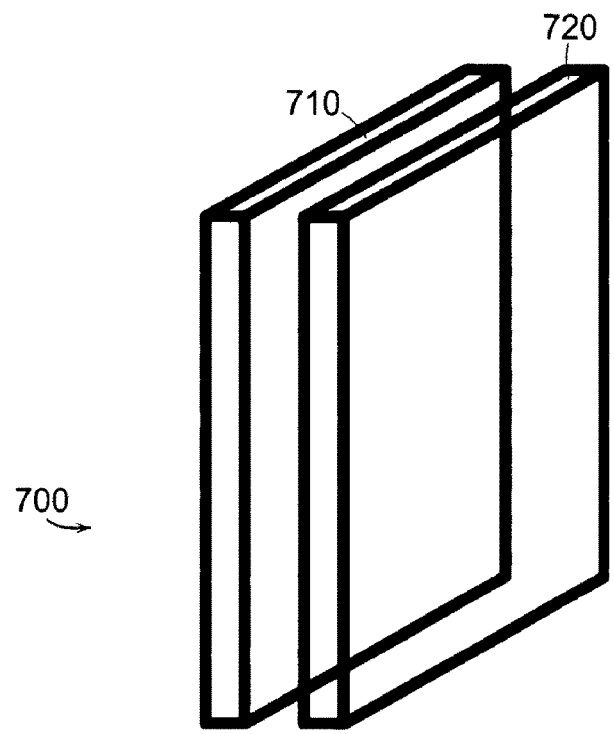
FIG. 14 shows a perspective view of a parallel coplanar waveguide.

FIG. 14 shows a parallel coplanar waveguide 700 including a first electrical conductor 710 and a second electrical conductor 720. In an embodiment, the first and second electrical conductors 710 and 720 are approximately parallel to each other. In an embodiment, the first and second electrical conductors 710 and 720 are metallic electrodes. A photovoltaic material can be located in the space between the electrical conductors 710 and 720. Air or a vacuum can also be located in the space between the electrical conductors 710 and 720. When the intervening space between the electrical conductors 710 and 720 is filled with photovoltaic material, the waveguiding function delivers light energy to the photovoltaic material, where it is converted to electrical energy.

Figure 15:
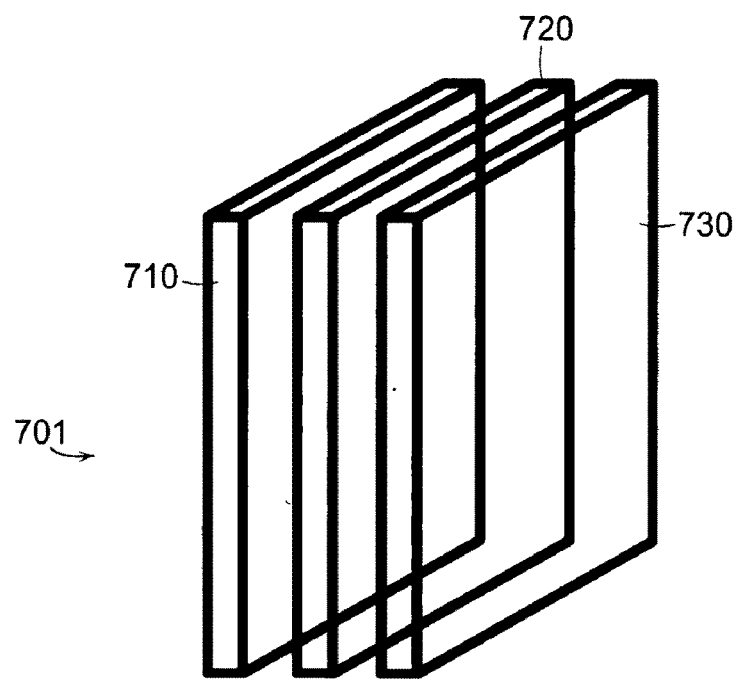
FIG. 15 shows a perspective view of a multi-layer parallel coplanar waveguide.

FIG. 15 shows a multi-layer parallel coplanar waveguide 701 including a plurality of electrical conductors 710, 720, 730. In an embodiment, the plurality of electrical conductors are approximately parallel to each other. In an embodiment, the plurality of electrical conductors are metallic electrodes. A photovoltaic material can be located in the spaces between the plurality of electrical conductors. Air or a vacuum can also be located in the space between the plurality of electrical conductors. When the intervening space between the plurality of electrical conductors is filled with photovoltaic material, the waveguiding function acts to deliver light energy to the photovoltaic material, where it is converted to electrical energy.

Some of the inner electrical conductors can be made of transparent metals. For example, the middle electrical conductor 720 in FIG. 15 can be made of a transparent metal. For an optical propagating mode (i.e., TEM mode) this structure is a parallel coplanar waveguide 701 (similar to FIG. 14), but with an additional bias electrode. A multi-mode propagation can be achieved with sufficiently large inter-electrode spacing.

Figure 16:
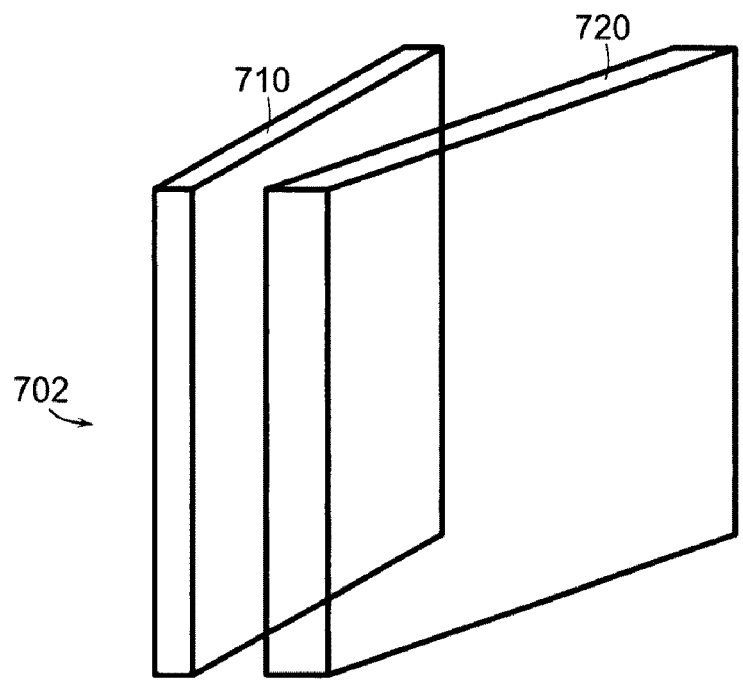
FIG. 16 shows a perspective view of a nonparallel coplanar waveguide.

FIG. 16 shows a nonparallel coplanar waveguide 702 in which the first electrical conductor 710 and the second electrical conductor 720 are not parallel. In an embodiment, the first and second electrical conductors 710 and 720 are metallic electrodes. A photovoltaic material can be located in the space between the electrical conductors 710 and 720. Air or a vacuum can also be located in the space between the electrical conductors 710 and 720. When the intervening space between the electrical conductors 710 and 720 is filled with photovoltaic material, the waveguiding function delivers light energy to the photovoltaic material, where it is converted to electrical energy. In an embodiment, a multilayer version of the nonparallel coplanar waveguide has three or more nonparallel electrical conductors.

Figure 17:
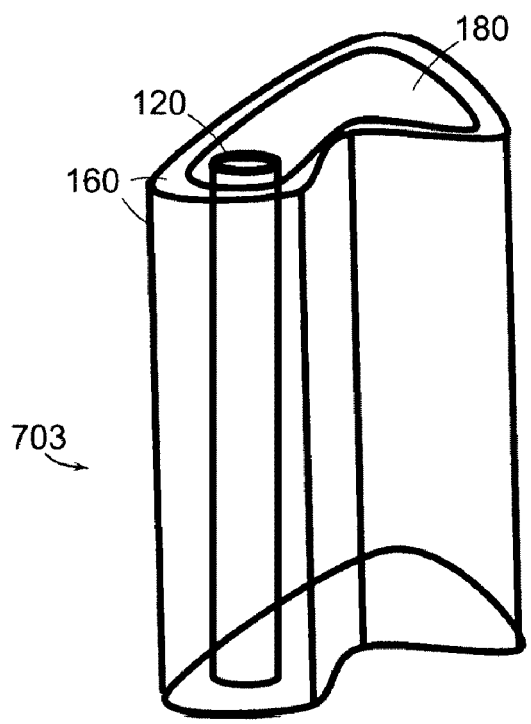
FIG. 17 shows a perspective view of an arbitrary shape cometal waveguide.

FIG. 17 shows an arbitrary shape cometal waveguide 703. The structure shape is invariant in the propagation direction. In a embodiment, a multilayer version of the arbitrary shape cometal waveguide has three or more layers. A photovoltaic material 180 can be located in the space between an inner conductor 120 and an outer conductor 160. When the intervening space between the inner conductor 120 and the outer conductor 160 is filled with photovoltaic material 180, the waveguiding function acts to deliver light energy to the photovoltaic material 180, where it is converted to electrical energy.

The inner conductors, the outer conductors and the devices can have various shapes, including but not limited to round, square, rectangular, circular, cylindrical and other symmetrical and non-symmetrical shapes. Certain shapes may be more efficient by allowing for an increase or decrease in the density of the devices on an array. Those skilled in the art will recognize that the inner conductors, the outer conductors and the devices can have any shape and any cross section and still be within the spirit and scope of the present invention.

A nanoscale optics apparatus for use as a solar cell comprises a plurality of nanoscale cometal structures each comprising a photovoltaic material located between a first electrical conductor and a second electrical conductor. The nanoscale optics apparatus is a cometal solar cell.

The thickness of the photovoltaic material is the separation distance between the first electrical conductor and the second electrical conductor. In an embodiment, the separation distance between the first electrical conductor and the second electrical conductor is nanoscale and the thickness of the photovoltaic material is nanoscale. Charge carriers (electrons and holes) liberated by solar energy via a photovoltaic effect need travel only nanoscale distances to be harvested in the form of electric current or voltage. The thickness of the photovoltaic material should be approximately the same as or less than the carrier diffusion length. For example, in amorphous silicon (Si), the carrier diffusion length is about 100 nm. For TEM propagation, the overall inter-electrode spacing in the cometal structure should be approximately the same as the photovoltaic material.

For a sufficiently large inter-electrode spacing, multi-mode propagation occurs in which the TE (transverse electric) and/or TM (transverse magnetic) modes can propagate in addition to the TEM mode. Multi-mode propagation can occur with a transparent conductor core (inner conductor) or a transparent conductor located between the inner conductor and the outer conductor (in addition to the photovoltaic material). The transparent conductor can have a diameter smaller or larger than the light wavelength, so that light can enter directly in addition to indirectly via an antenna. The transparent conductor may have a nanoscale-thickness photovoltaic material on one or both sides. For multi-mode propagation, the overall inter-electrode spacing in the cometal structure should be approximately the same as the light wavelength.

In an embodiment, a protruding portion of the first electrical conductor extends beyond the second electrical conductor to act as antenna. A substrate may support the plurality of nanoscale cometal structures. In an embodiment, a transparent conductor is located between the first electrical conductor and the second electrical conductor.

In an embodiment, the plurality of cometal structures are connected in series, resulting in a total voltage being approximately a sum of voltages photo-generated by each cometal structure. In an embodiment, the plurality of cometal structures are connected in parallel, resulting in a total voltage between a minimum and a maximum of the voltages photo-generated by each cometal structure.

In a photovoltaic solar cell, light energy is absorbed by the photovoltaic semiconductor medium and transferred to electrons in the semiconductor valence band. This increases the energy of the electrons, promoting them to the semiconductor conduction band, where they become mobile. Each electron that has been promoted to the conduction band leaves behind a hole in the valence band. The hole can be considered a positively-charged entity, in contrast to the electron's negative electrical charge, and the hole is also mobile. Once this electron-hole pair has been generated, each of the electron and the hole must be harvested, by migrating to a metal electrode. The migration happens under the influence of an electric field, with the holes moving in the direction of the field, the electrons against the field.

An electric field in a solar cell can be created in several ways including a Schottky barrier, a p-n junction and a p-i-n junction. A Schottky barrier is a metal-semiconductor junction that has rectifying characteristics, suitable for use as a diode. Most metal-semiconductor junctions intrinsically form a Schottky barrier. By forming two Schottky barriers, one at each metal-semiconductor junction in the cometal structure, an appropriate electric field is established. A p-n junction is formed by combining n-type semiconductors and p-type semiconductors together in close contact. A p-n junction also establishes an electric field. A p-i-n junction (p-type semiconductor, intrinsic semiconductor, n-type semiconductor) is a junction diode with a wide, undoped intrinsic semiconductor region between p-type semiconductor and n-type semiconductor regions. For solar cells, the p- and n-regions are thin relative to the intrinsic semiconductor region, and are present to establish the electric field.

Figure 18:
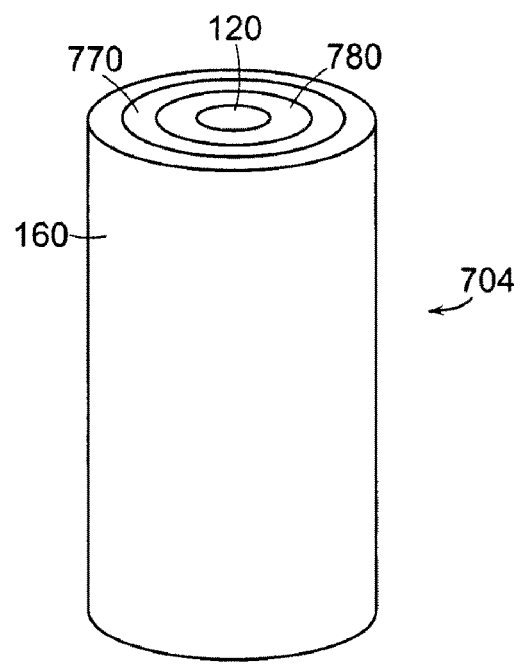
FIG. 18 shows a perspective view of a nanoscale coaxial solar cell having a p-n junction.

FIG. 18 shows a nanoscale coaxial solar cell 704 having a p-n junction. The p-type photovoltaic semiconductor layer 770 and the n-type photovoltaic semiconductor layer 780 can be interchanged, so either one can be adjacent to the inner electrical conductor 120 with the other adjacent to the outer conductor 160. The solar cell is a coaxial p-n junction cometal solar cell.

Figure 19:
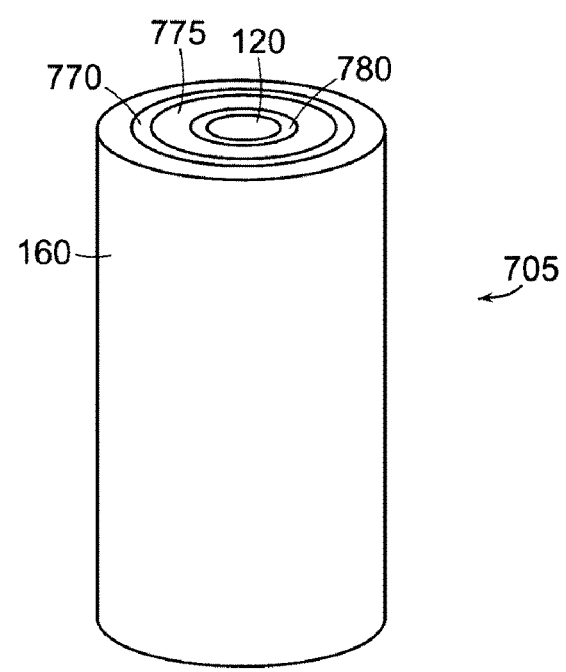
FIG. 19 shows a perspective view of a nanoscale coaxial solar cell having a p-i-n junction.

FIG. 19 shows a nanoscale coaxial solar cell 705 having a p-i-n junction. The p-type photovoltaic semiconductor 770 layer and the n-type photovoltaic semiconductor layer 780 can be interchanged, so either one can be adjacent to the inner electrical conductor 120 with the other adjacent to the outer conductor 160. The intrinsic semiconductor layer 775 is between the p-type 770 layer and the n-type layer 780. The solar cell is a coaxial p-i-n junction cometal solar cell.

A solar cell comprises a plurality of nanoscale coaxial structures each comprising an electrically conducting core contacting a photovoltaic material and coated with an outer electrical conductor layer. The solar cell is a coaxial cometal solar cell.

In an embodiment, the photovoltaic material contacts a portion of the electrically conducting core. A substrate may support the plurality of nanoscale coaxial structures. In an embodiment, the photovoltaic material contains a p-n junction comprised of photovoltaic semiconductors. In an embodiment, the photovoltaic material contains a p-i-n junction formed of a p-type semiconductor layer, an intrinsic photovoltaic semiconductor layer and an n-type semiconductor layer. In an embodiment, a transparent conductor is located between the electrically conducting core and the outer electrical conductor layer.

In an embodiment, a protruding portion of the electrically conducting core extends beyond the outer electrical conductor layer to act as an antenna. The solar cell is a coaxial cometal solar cell having an antenna.

In an embodiment, the plurality of coaxial structures are connected in series, resulting in a total voltage being a sum of voltages photo-generated by each coaxial structure. In an embodiment, the plurality of coaxial structures are connected in parallel, resulting in a total voltage between a minimum and a maximum of the voltages photo-generated by each cometal structure.

Figure 20:
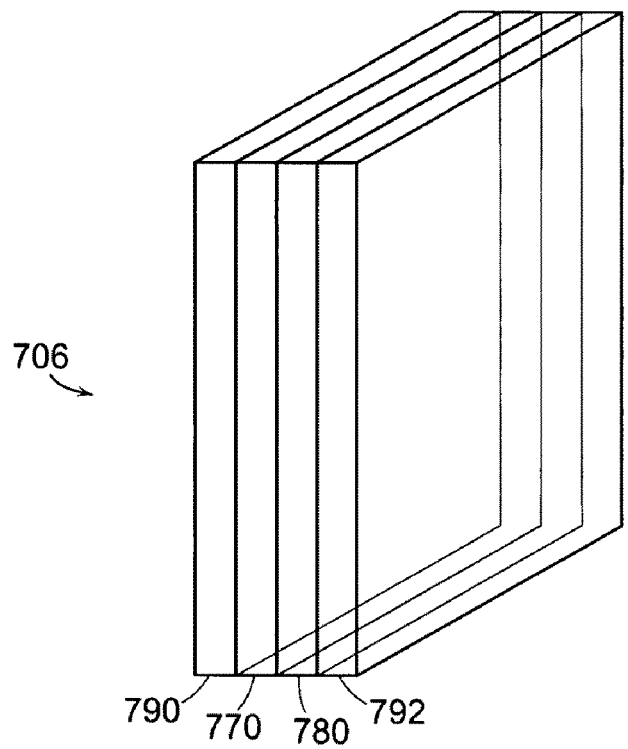
FIG. 20 shows a perspective view of a nanoscale coplanar solar cell having a p-n junction.

FIG. 20 shows a nanoscale coplanar solar cell 706 having a p-n junction. The p-type photovoltaic semiconductor layer 770 and the n-type photovoltaic semiconductor layer 780 can be interchanged, so either one can be adjacent to the first electrically conducting layer 790 with the other adjacent to the second electrically conducting layer 792. The solar cell is a coplanar p-n junction cometal solar cell.

Figure 21:
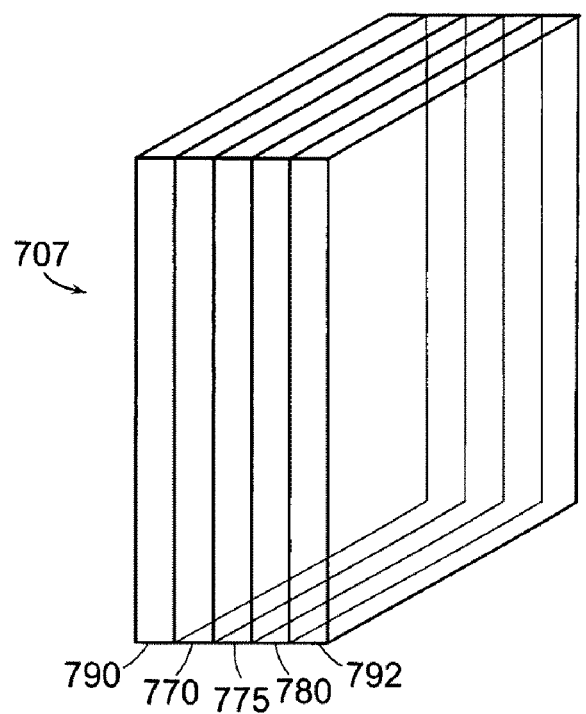
FIG. 21 shows a perspective view of a nanoscale coplanar solar cell having a p-i-n junction.

FIG. 21 shows a nanoscale coplanar solar cell 707 having a p-i-n junction. The p-type photovoltaic semiconductor layer 770 and the n-type photovoltaic semiconductor layer 780 can be interchanged, so either one can be adjacent to the first electrically conducting layer 790 with the other adjacent to the second electrically conducting layer 792. The intrinsic semiconductor layer 775 is between the p-type 770 layer and the n-type layer 780. The solar cell is a coplanar p-i-n junction cometal solar cell.

A solar cell comprises a plurality of nanoscale coplanar structures each comprising a photovoltaic layer located between a first electrically conducting layer and a second electrically conducting layer; wherein light enters the coplanar structure between the first electrically conducting layer and the second electrically conducting layer. The solar cell is a coplanar cometal solar cell.

In an embodiment, the first electrically conducting layer is approximately parallel to the second electrically conducting layer. A substrate may support the plurality of nanoscale coplanar structures. In an embodiment, the first electrically conducting layer and the second electrically conducting layer are electrically contacted only through the photovoltaic layer. In an embodiment, the photovoltaic layer contains a planar p-n junction. In an embodiment, the photovoltaic layer contains a planar p-i-n junction formed of a p-type semiconductor layer, an intrinsic photovoltaic semiconductor layer and an n-type semiconductor layer. In an embodiment, a transparent conductor is located between the first electrically conducting layer and the second electrically conducting layer.

In an embodiment, a protruding portion of the first electrically conducting layer extends beyond the second electrically conducting layer. The solar cell is a coplanar cometal solar cell having an antenna.

In an embodiment, the plurality of coplanar structures are connected in series, resulting in a total voltage being a sum of voltages photo-generated by each coplanar structure. In an embodiment, the plurality of coplanar structures are connected in parallel, resulting in a total voltage between a minimum and a maximum of the voltages photo-generated by each cometal structure.

Figure 22:
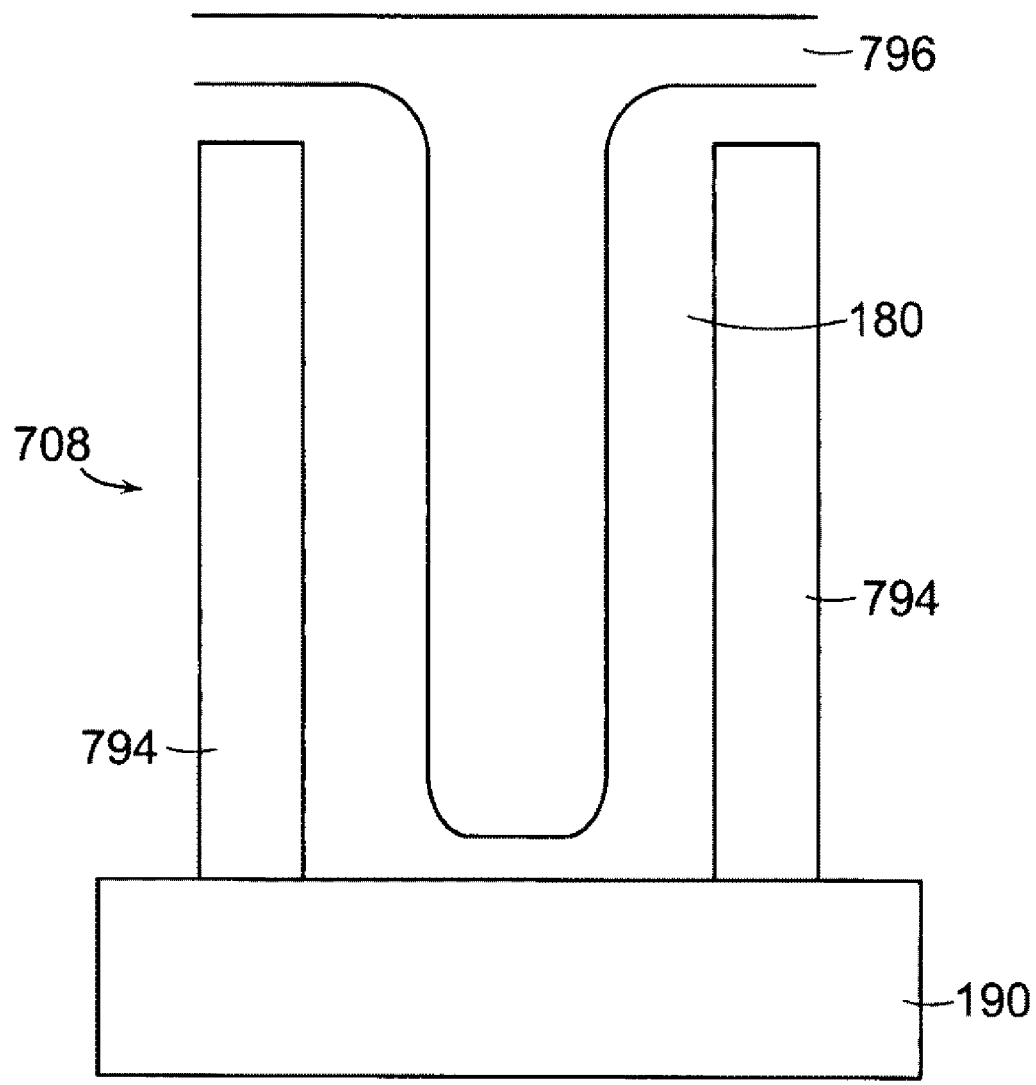
FIG. 22 shows a side view of a nanoscale coplanar solar cell.

FIG. 22 shows a side view of a nanoscale coplanar solar cell 708. In this embodiment, the second metal 796 is located between two of the first metals 794 with a photovoltaic material 180 located between the first metal 794 and the second metal 796. The multiple first metals 794 may be parallel to each other or at an angle. The second metal 796 and the first metals 794 may be parallel to each other or at an angle. The second metal 796 also serves as a top conductor. The photovoltaic material 180 can be any photovoltaic material, p-n junction, or p-i-n junction configurations described herein or known in the art. When the substrate is conducting and transparent, light energy from below reaches the photovoltaic material 180, where it is converted to electrical energy in the nanoscale coplanar solar cell.

A nanoscale optics apparatus for use as a solar cell comprises a plurality of nanoscale coaxial structures comprising an internal conductor surrounded by a photovoltaic material coated with an outer conductor; a film having the plurality of nanoscale coaxial structures; and a protruding portion of the an internal conductor extending beyond a surface of the film.

A method of fabricating solar cells comprises coating a substrate with a catalytic material; growing a plurality of carbon nanotubes as internal cores of nanoscale coaxial units on the substrate; coating with a photovoltaic film; and coating with a metallic medium. The method further comprises oxidizing the substrate prior to coating with a photovoltaic film.

A method of fabricating a solar cell comprises coating a substrate with a chromium layer; electrodepositing a catalytic transition metal on the coated substrate; growing an array of carbon nanotubes (CNTs) on the coated substrate; etching the chromium layer; coating the coated substrate and the array of CNTs with a photovoltaic material; and coating the coated substrate and the array of CNTs with a metal material.

A method of fabricating solar cells comprises preparing a plurality of nanoscale planar structures; coating a plurality of planar surfaces of the plurality of planar structures with a photovoltaic semiconductor while leaving space between the plurality of planar surfaces; and coating the photovoltaic semiconductor with an outer electrical conductor layer, wherein a portion of the outer electrical conductor layer is located between the planar structures to form coplanar structures. In an embodiment, the photovoltaic material conformally coats the plurality of planar surfaces of the plurality of planar structures. The photovoltaic material only partially fills the space between the planar structures and does not completely fill the space. In an embodiment, the metallic nanoscale coplanar structures are prepared on an optically transparent substrate allowing light energy from the substrate side to reach the photovoltaic material where it is converted to electrical energy in the solar cell. In an embodiment, the metallic nanoscale coplanar structures are prepared on an optically opaque substrate and the top metal coating is transparent, admitting light through the top metal coating side to reach the photovoltaic material where it is converted to electrical energy in the solar cell.

All patents, patent applications, and published references cited herein are hereby incorporated by reference in their entirety. It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A solar cell comprising:
a substrate having a major surface; and
a plurality of nanoscale cometal structures each comprising a photovoltaic material located between a first electrical conductor and a second electrical conductor,
wherein the first electrical conductor is configured to function as an electromagnetic radiation receiving antenna,
wherein the plurality of cometal structures are defined by a long dimension perpendicular to the major surface of the substrate, and wherein the long dimension is substantially parallel to a direction of propagation of incident electromagnetic radiation,
wherein a thickness of the photovoltaic material is equal to or less than a carrier diffusion length, and
wherein an overall inter-electrode spacing in each cometal structure is approximately equal to the thickness of the photovoltaic material and sufficiently small to propagate transverse electromagnetic (TEM) waves of incident electromagnetic radiation in between the first electrical conductor and the second electrical conductor.

2. The solar cell of claim 1 further comprising a protruding portion of the first electrical conductor extending beyond the second electrical conductor.

3. The solar cell of claim 1 wherein the substrate supports the plurality of nanoscale cometal structures.

4. The solar cell of claim 1 further comprising a transparent conductor located between the first electrical conductor and the second electrical conductor.

5. The solar cell of claim 1 wherein the plurality of cometal structures are connected in series, resulting in a total voltage being approximately a sum of voltages photo-generated by each cometal structure.

6. The solar cell of claim 1 wherein the plurality of cometal structures are connected in parallel, resulting in a total voltage between a minimum and a maximum of the voltages photo-generated by each cometal structure.

7. The solar cell of claim 1 wherein a the thickness of the photovoltaic material is approximately the same as the carrier diffusion length.

8. A solar cell comprising:
a substrate having a major surface; and
a plurality of nanoscale coaxial structures each comprising an electrically conducting core contacting a photovoltaic material and coated with an outer electrical conductor layer,
wherein the electrically conducting core is configured to function as an electromagnetic radiation receiving antenna,
wherein the plurality of coaxial structures are defined by a long dimension perpendicular to the major surface of the substrate, and wherein the long dimension is substantially parallel to a direction of propagation of incident electromagnetic radiation,
wherein a thickness of the photovoltaic material is equal to or less than a carrier diffusion length, and
wherein an overall inter-electrode spacing in each coaxial structure is approximately equal to the thickness of the photovoltaic material and sufficiently small to propagate transverse electromagnetic (TEM) waves of incident electromagnetic radiation in between the electrically conducting core and the outer electrical conductor layer.

9. The solar cell of claim 8 wherein the photovoltaic material contacts a portion of the electrically conducting core.

10. The solar cell of claim 8 further comprising a protruding portion of the electrically conducting core extending beyond the outer electrical conductor layer.

11. The solar cell of claim 8 wherein the substrate supports the plurality of nanoscale coaxial structures.

12. The solar cell of claim 8 wherein the photovoltaic material contains a p-n junction comprised of photovoltaic semiconductors.

13. The solar cell of claim 8 wherein the photovoltaic material contains a p-i-n junction formed of a p-type semiconductor layer, an intrinsic photovoltaic semiconductor layer and an n-type semiconductor layer.

14. The solar cell of claim 8 further comprising a transparent conductor located between the electrically conducting core and the outer electrical conductor layer.

15. The solar cell of claim 8 wherein the plurality of coaxial structures are connected in series, resulting in a total voltage being a sum of voltages photo-generated by each coaxial structure.

16. The solar cell of claim 8 wherein the plurality of coaxial structures are connected in parallel, resulting in a total voltage between a minimum and a maximum of the voltages photo-generated by each cometal structure.

17. The solar cell of claim 8 wherein the thickness of the photovoltaic material is approximately the same as the carrier diffusion length.

* * * * *

UNITED STATES PATENT AND TRADEMARK OFFICE
CERTIFICATE OF CORRECTION

PATENT NO. : 7,943,847 B2  
APPLICATION NO. : 11/509269  
DATED : May 17, 2011  
INVENTOR(S) : Krzysztof J. Kempa et al.

Page 1 of 1

It is certified that error appears in the above-identified patent and that said Letters Patent is hereby corrected as shown below:

Col. 20, Ln. 43, Delete "a".

Signed and Sealed this
Twenty-first Day of June, 2011

David J. Kappos
*Director of the United States Patent and Trademark Office*